(12) United States Patent
Liao et al.

(10) Patent No.: US 9,007,273 B2
(45) Date of Patent: Apr. 14, 2015

(54) SEMICONDUCTOR PACKAGE INTEGRATED WITH CONFORMAL SHIELD AND ANTENNA

(75) Inventors: Kuo-Hsien Liao, TaiChung (TW); Chi-Hong Chan, Hong Kong (HK); Shih Fuyu, Benitachell (ES)

(73) Assignee: Advances Semiconductor Engineering, Inc. (TW)

( * ) Notice: Subject to any disclaimer, the term of this patent is extended or adjusted under 35 U.S.C. 154(b) by 353 days.

(21) Appl. No.: 13/205,558

(22) Filed: Aug. 8, 2011

(65) Prior Publication Data

US 2012/0062439 A1 Mar. 15, 2012

Related U.S. Application Data

(60) Provisional application No. 61/430,808, filed on Jan. 7, 2011.

(30) Foreign Application Priority Data

Sep. 9, 2010 (TW) ................................ 99130565 A

(51) Int. Cl.
*H01Q 1/52* (2006.01)
*H01L 23/48* (2006.01)
(Continued)

(52) U.S. Cl.
CPC ............ *H01Q 1/2283* (2013.01); *H01L 23/055* (2013.01); *H01L 23/295* (2013.01);
(Continued)

(58) Field of Classification Search
USPC ............. 343/702, 841, 700 MS, 792; 342/51, 342/175, 45
See application file for complete search history.

(56) References Cited

U.S. PATENT DOCUMENTS

| 3,761,782 A | 9/1973 | Youmans |
| 4,394,712 A | 7/1983 | Anthony |

(Continued)

FOREIGN PATENT DOCUMENTS

| CN | 101401206 A | 4/2009 |
| JP | 08-288686 A | 1/1996 |

(Continued)

OTHER PUBLICATIONS

SIPO Office Action with translation of search report, dated Dec. 5, 2012, for Chinese Patent Application No. 201110275954.X.

(Continued)

*Primary Examiner* — Huedung Mancuso
(74) *Attorney, Agent, or Firm* — Morgan Law Offices, PLC

(57) ABSTRACT

A semiconductor package integrated with conformal shield and antenna is provided. The semiconductor package includes a semiconductor element, an electromagnetic interference shielding element, a dielectric structure, an antenna element and an antenna signal feeding element. The electromagnetic interference shielding element includes an electromagnetic interference shielding film and a grounding element, wherein the electromagnetic interference shielding film covers the semiconductor element and the grounding element is electrically connected to the electromagnetic interference shielding layer and a grounding segment of the semiconductor element. The dielectric structure covers a part of the electromagnetic interference shielding element and has an upper surface. The antenna element is formed adjacent to the upper surface of the dielectric structure. The antenna signal feeding element passing through the dielectric structure electrically connects the antenna element and the semiconductor element.

17 Claims, 40 Drawing Sheets

(51) Int. Cl.
*H01L 23/552* (2006.01)
*H01L 23/00* (2006.01)
*H01L 25/16* (2006.01)
*H01Q 1/22* (2006.01)
H01L 23/055 (2006.01)
H01L 23/29 (2006.01)

(52) U.S. Cl.
CPC ............ H01L23/481 (2013.01); H01L 23/552 (2013.01); H01L 24/97 (2013.01); H01L 25/16 (2013.01); *H01L 2223/6677* (2013.01); *H01L 2224/16225* (2013.01); *H01L 2224/48227* (2013.01); *H01L 2224/81* (2013.01); *H01L 2224/85* (2013.01); *H01L 2224/97* (2013.01); *H01L 2924/00* (2013.01); *H01L 2924/01029* (2013.01); *H01L 2924/1531* (2013.01); *H01L 2924/15311* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01); H01Q 1/526 (2013.01); *Y10T 29/41* (2015.01)

(56) References Cited

U.S. PATENT DOCUMENTS

| | | | |
|---|---|---|---|
| 4,499,655 | A | 2/1985 | Anthony |
| 4,569,786 | A | 2/1986 | Deguchi |
| 4,807,021 | A | 2/1989 | Okumura |
| 4,814,205 | A | 3/1989 | Arcilesi et al. |
| 4,842,699 | A | 6/1989 | Hua et al. |
| 4,897,708 | A | 1/1990 | Clements |
| 4,982,265 | A | 1/1991 | Watanabe et al. |
| 5,166,097 | A | 11/1992 | Tanielian |
| 5,166,772 | A | 11/1992 | Soldner et al. |
| 5,191,405 | A | 3/1993 | Tomita et al. |
| 5,229,647 | A | 7/1993 | Gnadinger |
| 5,239,448 | A | 8/1993 | Perkins et al. |
| 5,308,443 | A | 5/1994 | Sugihara |
| 5,353,498 | A | 10/1994 | Fillion et al. |
| 5,355,016 | A | 10/1994 | Swirbel et al. |
| 5,400,039 | A * | 3/1995 | Araki et al. ............ 343/700 MS |
| 5,404,044 | A | 4/1995 | Booth et al. |
| 5,557,142 | A | 9/1996 | Gilmore et al. |
| 5,615,477 | A | 4/1997 | Sweitzer |
| 5,639,989 | A | 6/1997 | Higgins, III |
| 5,643,831 | A | 7/1997 | Ochiai et al. |
| 5,677,511 | A | 10/1997 | Taylor et al. |
| 5,694,300 | A | 12/1997 | Mattei et al. |
| 5,776,798 | A | 7/1998 | Quan et al. |
| 5,886,876 | A | 3/1999 | Yamaguchi |
| 5,895,229 | A | 4/1999 | Carney et al. |
| 5,998,292 | A | 12/1999 | Black et al. |
| 5,998,867 | A | 12/1999 | Jensen et al. |
| 6,093,972 | A | 7/2000 | Carney et al. |
| 6,150,193 | A | 11/2000 | Glenn |
| 6,225,694 | B1 | 5/2001 | Terui |
| 6,276,599 | B1 | 8/2001 | Ogawa |
| 6,329,631 | B1 | 12/2001 | Yueh |
| 6,376,769 | B1 | 4/2002 | Chung |
| 6,406,934 | B1 | 6/2002 | Glenn et al. |
| 6,448,506 | B1 | 9/2002 | Glenn et al. |
| 6,457,633 | B1 | 10/2002 | Takashima et al. |
| 6,577,013 | B1 | 6/2003 | Glenn et al. |
| 6,586,822 | B1 | 7/2003 | Vu et al. |
| 6,614,102 | B1 | 9/2003 | Hoffman et al. |
| 6,670,269 | B2 | 12/2003 | Mashino |
| 6,686,649 | B1 | 2/2004 | Mathews et al. |
| 6,699,787 | B2 | 3/2004 | Mashino |
| 6,740,546 | B2 | 5/2004 | Corisis et al. |
| 6,740,950 | B2 | 5/2004 | Paek |
| 6,740,959 | B2 | 5/2004 | Alcoe et al. |
| 6,757,181 | B1 | 6/2004 | Villanueva |
| 6,770,955 | B1 | 8/2004 | Coccioli et al. |
| 6,781,231 | B2 | 8/2004 | Minervini |
| 6,812,549 | B2 | 11/2004 | Umetsu et al. |
| 6,815,348 | B2 | 11/2004 | Mashino |
| 6,838,776 | B2 | 1/2005 | Leal et al. |
| 6,865,084 | B2 | 3/2005 | Lin et al. |
| 6,881,896 | B2 | 4/2005 | Ebihara |
| 6,962,829 | B2 | 11/2005 | Glenn et al. |
| 6,962,869 | B1 | 11/2005 | Bao et al. |
| 6,998,532 | B2 | 2/2006 | Kawamoto et al. |
| 7,030,469 | B2 | 4/2006 | Mahadevan et al. |
| 7,042,398 | B2 | 5/2006 | Tang et al. |
| 7,045,385 | B2 | 5/2006 | Kim et al. |
| 7,049,682 | B1 | 5/2006 | Mathews et al. |
| 7,078,269 | B2 | 7/2006 | Yamasaki et al. |
| 7,081,661 | B2 | 7/2006 | Takehara et al. |
| 7,125,744 | B2 | 10/2006 | Takehara et al. |
| 7,134,198 | B2 | 11/2006 | Nakatani et al. |
| 7,157,372 | B1 | 1/2007 | Trezza |
| 7,161,252 | B2 | 1/2007 | Tsuneoka et al. |
| 7,186,928 | B2 | 3/2007 | Kikuchi et al. |
| 7,187,060 | B2 | 3/2007 | Usui |
| 7,215,032 | B2 | 5/2007 | Trezza |
| 7,222,420 | B2 | 5/2007 | Moriizumi |
| 7,238,590 | B2 | 7/2007 | Yang et al. |
| 7,262,475 | B2 | 8/2007 | Kwon et al. |
| 7,276,787 | B2 | 10/2007 | Edelstein et al. |
| 7,285,434 | B2 | 10/2007 | Yee et al. |
| 7,298,030 | B2 | 11/2007 | McWilliams et al. |
| 7,327,015 | B2 | 2/2008 | Yang et al. |
| 7,334,326 | B1 | 2/2008 | Huemoeller et al. |
| 7,342,303 | B1 | 3/2008 | Berry et al. |
| 7,365,436 | B2 | 4/2008 | Yamano |
| 7,371,602 | B2 | 5/2008 | Yee |
| 7,388,293 | B2 | 6/2008 | Fukase et al. |
| 7,415,762 | B2 | 8/2008 | Fukase et al. |
| 7,451,539 | B2 | 11/2008 | Morris et al. |
| 7,478,474 | B2 | 1/2009 | Koga |
| 7,482,272 | B2 | 1/2009 | Trezza |
| 7,488,903 | B2 | 2/2009 | Kawagishi et al. |
| 7,504,721 | B2 | 3/2009 | Chen et al. |
| 7,508,057 | B2 | 3/2009 | Shiraishi et al. |
| 7,508,079 | B2 | 3/2009 | Higashi |
| 7,528,053 | B2 | 5/2009 | Huang et al. |
| 7,538,033 | B2 | 5/2009 | Trezza |
| 7,548,205 | B2 * | 6/2009 | Mohamadi ............. 343/700 MS |
| 7,553,752 | B2 | 6/2009 | Kuan et al. |
| 7,560,744 | B2 | 7/2009 | Hsiao et al. |
| 7,576,415 | B2 | 8/2009 | Cha et al. |
| 7,598,163 | B2 | 10/2009 | Callahan et al. |
| 7,605,463 | B2 | 10/2009 | Sunohara |
| 7,625,818 | B2 | 12/2009 | Wang |
| 7,629,674 | B1 | 12/2009 | Foster |
| 7,633,170 | B2 | 12/2009 | Yang et al. |
| 7,633,765 | B1 | 12/2009 | Scanlan et al. |
| 7,642,132 | B2 | 1/2010 | Huang et al. |
| 7,656,023 | B2 | 2/2010 | Sunohara et al. |
| 7,656,047 | B2 | 2/2010 | Yang et al. |
| 7,659,202 | B2 | 2/2010 | Trezza |
| 7,666,711 | B2 | 2/2010 | Pagaila et al. |
| 7,678,685 | B2 | 3/2010 | Sunohara et al. |
| 7,681,779 | B2 | 3/2010 | Yang |
| 7,687,397 | B2 | 3/2010 | Trezza |
| 7,691,747 | B2 | 4/2010 | Lin et al. |
| 7,700,411 | B2 | 4/2010 | Yang et al. |
| 7,733,661 | B2 | 6/2010 | Kossives et al. |
| 7,741,148 | B1 | 6/2010 | Marimuthu et al. |
| 7,741,152 | B2 | 6/2010 | Huang et al. |
| 7,741,156 | B2 | 6/2010 | Pagaila et al. |
| 7,745,910 | B1 | 6/2010 | Olson et al. |
| 7,772,081 | B2 | 8/2010 | Lin et al. |
| 7,772,118 | B2 | 8/2010 | Yamano |
| 7,786,008 | B2 | 8/2010 | Do et al. |
| 7,786,592 | B2 | 8/2010 | Trezza |
| 7,795,140 | B2 | 9/2010 | Taguchi et al. |
| 7,808,060 | B2 | 10/2010 | Hsiao |
| 7,808,111 | B2 | 10/2010 | Trezza |
| 7,811,858 | B2 | 10/2010 | Wang et al. |
| 7,816,265 | B2 | 10/2010 | Wang |
| 7,829,981 | B2 | 11/2010 | Hsu |

(56) References Cited

U.S. PATENT DOCUMENTS

| | | |
|---|---|---|
| 7,842,597 B2 | 11/2010 | Tsai |
| 7,868,462 B2 | 1/2011 | Choi et al. |
| 7,884,776 B2 * | 2/2011 | Mohamadi .................. 343/853 |
| 7,944,038 B2 | 5/2011 | Chiu et al. |
| 8,125,788 B2 | 2/2012 | Hatanaka et al. |
| 2002/0017855 A1 | 2/2002 | Cooper et al. |
| 2002/0094605 A1 | 7/2002 | Pai et al. |
| 2003/0132430 A1 | 7/2003 | Tsai |
| 2004/0020673 A1 | 2/2004 | Mazurkiewicz |
| 2004/0124518 A1 | 7/2004 | Karnezos |
| 2004/0150097 A1 | 8/2004 | Gaynes et al. |
| 2004/0178500 A1 | 9/2004 | Usui |
| 2004/0231872 A1 | 11/2004 | Arnold et al. |
| 2004/0252475 A1 | 12/2004 | Tsuneoka et al. |
| 2004/0259292 A1 | 12/2004 | Beyne et al. |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0189635 A1 | 9/2005 | Humpston et al. |
| 2005/0208702 A1 | 9/2005 | Kim |
| 2005/0258545 A1 | 11/2005 | Kwon |
| 2006/0027632 A1 | 2/2006 | Akram |
| 2006/0092079 A1 * | 5/2006 | de Rochemont ....... 343/700 MS |
| 2006/0145361 A1 | 7/2006 | Yang et al. |
| 2006/0176211 A1 * | 8/2006 | Mohamadi .................. 342/51 |
| 2006/0197216 A1 | 9/2006 | Yee |
| 2006/0266547 A1 | 11/2006 | Koga |
| 2007/0048896 A1 | 3/2007 | Andry et al. |
| 2007/0138562 A1 | 6/2007 | Trezza |
| 2007/0187711 A1 | 8/2007 | Hsiao et al. |
| 2008/0042301 A1 | 2/2008 | Yang et al. |
| 2008/0061407 A1 | 3/2008 | Yang et al. |
| 2008/0174013 A1 | 7/2008 | Yang et al. |
| 2008/0272486 A1 | 11/2008 | Wang et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0025211 A1 | 1/2009 | Hiner et al. |
| 2009/0032928 A1 | 2/2009 | Chiang et al. |
| 2009/0035895 A1 | 2/2009 | Lee et al. |
| 2009/0039527 A1 | 2/2009 | Chan et al. |
| 2009/0091904 A1 | 4/2009 | Hatanaka et al. |
| 2009/0102003 A1 | 4/2009 | Vogt et al. |
| 2009/0102033 A1 | 4/2009 | Raben |
| 2009/0140436 A1 | 6/2009 | Wang |
| 2009/0146297 A1 | 6/2009 | Badakere et al. |
| 2009/0166785 A1 | 7/2009 | Camacho et al. |
| 2009/0194851 A1 | 8/2009 | Chiu et al. |
| 2009/0194852 A1 | 8/2009 | Chiu et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0236700 A1 | 9/2009 | Moriya |
| 2009/0243045 A1 | 10/2009 | Pagaila et al. |
| 2009/0256244 A1 | 10/2009 | Liao et al. |
| 2009/0289343 A1 | 11/2009 | Chiu et al. |
| 2009/0294959 A1 | 12/2009 | Chiang et al. |
| 2009/0302435 A1 | 12/2009 | Pagaila et al. |
| 2009/0302437 A1 | 12/2009 | Kim et al. |
| 2009/0309235 A1 | 12/2009 | Suthiwongsunthorn et al. |
| 2009/0321916 A1 | 12/2009 | Wang et al. |
| 2010/0006330 A1 | 1/2010 | Fu et al. |
| 2010/0013064 A1 | 1/2010 | Hsu |
| 2010/0032815 A1 | 2/2010 | An et al. |
| 2010/0059855 A1 | 3/2010 | Lin et al. |
| 2010/0065948 A1 | 3/2010 | Bae et al. |
| 2010/0073255 A1 | 3/2010 | Noll |
| 2010/0109132 A1 | 5/2010 | Ko et al. |
| 2010/0110656 A1 | 5/2010 | Ko et al. |
| 2010/0127937 A1 | 5/2010 | Chandrasekaran et al. |
| 2010/0133704 A1 | 6/2010 | Marimuthu et al. |
| 2010/0140737 A1 | 6/2010 | Lin et al. |
| 2010/0140751 A1 | 6/2010 | Tay et al. |
| 2010/0140752 A1 | 6/2010 | Marimuthu et al. |
| 2010/0140776 A1 | 6/2010 | Trezza |
| 2010/0148316 A1 | 6/2010 | Kim et al. |
| 2010/0187681 A1 | 7/2010 | Chen et al. |
| 2010/0197134 A1 | 8/2010 | Trezza |
| 2010/0199492 A1 | 8/2010 | Hiner et al. |
| 2010/0207257 A1 | 8/2010 | Lee |
| 2010/0207258 A1 | 8/2010 | Eun et al. |
| 2010/0207259 A1 | 8/2010 | Liao et al. |
| 2010/0230759 A1 | 9/2010 | Yang et al. |
| 2010/0230760 A1 | 9/2010 | Hung |
| 2010/0230788 A1 | 9/2010 | Peng |
| 2010/0244244 A1 | 9/2010 | Yang |
| 2010/0276690 A1 | 11/2010 | Chen |
| 2010/0327465 A1 | 12/2010 | Shen et al. |
| 2011/0048788 A1 | 3/2011 | Wang et al. |
| 2011/0068437 A1 | 3/2011 | Chiu et al. |
| 2011/0115059 A1 | 5/2011 | Lee et al. |
| 2011/0115060 A1 | 5/2011 | Chiu et al. |
| 2011/0115066 A1 | 5/2011 | Kim et al. |
| 2011/0127654 A1 | 6/2011 | Weng et al. |

FOREIGN PATENT DOCUMENTS

| | | |
|---|---|---|
| JP | 2002246540 A | 8/2002 |
| JP | 2004228135 A | 8/2004 |
| TW | 200612539 A | 4/2006 |
| WO | WO2004060034 A1 | 7/2004 |

OTHER PUBLICATIONS

SIPO Office Action with translation of search report, dated Aug. 9, 2013, for Chinese Patent Application No. 201110275954.X.

SIPO Office Action with translation of search report, dated Feb. 2, 2014, for Chinese Patent Application No. 201110275954.X.

SIPO Office Action with translation of search report, dated Sep. 9, 2014, for Chinese Patent Application No. 201110275954.X.

TWIPO Office Action with translation of search report, dated Apr. 25, 2014, for Taiwan Patent Application No. 100131940.

* cited by examiner

SEMICONDUCTOR PACKAGE INTEGRATED WITH CONFORMAL SHIELD AND ANTENNA

CROSS-REFERENCE TO RELATED APPLICATIONS

This application claims the benefit of Taiwan application Serial No. 99130565, filed Sep. 9, 2010, and U.S. provisional application Ser. No. 61/430,808, filed Jan. 7, 2011, the subject matter of which is incorporated herein by reference.

BACKGROUND OF THE INVENTION

1. Field of the Invention

The present invention relates to the field of semiconductor packaging, and, more particularly, to semiconductor packaging in wireless devices.

2. Description of the Related Art

Wireless communication devices, such as cell phones, require antennas for transmitting and receiving signals. Conventionally, a wireless communication device includes therein an antenna and a communication module (e.g., a semiconductor package with RF communication capability), each disposed on different parts of a circuit board. Under the conventional approach, the antenna and the communication module are separately manufactured and electrically connected after being placed on the circuit board. Since separate sets of equipment are separately manufactured, higher manufacturing costs are incurred. Moreover, the conventional approach makes it more difficult to achieve a compact product design.

Furthermore, since antenna signals are high-frequency signals, electromagnetic interference (EMI) may easily occur. EMI may interrupt, obstruct, or otherwise degrade or limit the effective performance of the circuit. As is known in the art, electromagnetic interference protection can be achieved using an electromagnetic interference shielding frame disposed on the circuit board.

SUMMARY OF THE INVENTION

One aspect of the disclosure relates to a semiconductor package. In one embodiment, the semiconductor package includes a semiconductor die, the semiconductor die having an integrated circuit portion and a substrate portion, the integrated circuit portion having an active surface and the substrate portion having an inactive surface; a via extending from the inactive surface and electrically connected to the integrated circuit portion; an electromagnetic interference shield disposed on the inactive surface and electrically connected to the via; a package body encapsulating portions of the die and the electromagnetic interference shield, the package body having an upper surface; a feeding element extending from the upper surface and electrically connected to the integrated circuit portion; and an antenna disposed on the upper surface and electrically connected to the feeding element.

Another aspect of the disclosure relates to a semiconductor package that includes a semiconductor die, the semiconductor die having an integrated circuit portion and a substrate portion, the integrated circuit portion having an active surface and the substrate portion having an inactive surface; a via extending from the inactive surface and electrically connected to the integrated circuit portion; an electromagnetic interference shield disposed on the inactive surface and electrically connected to the via; a dielectric layer disposed over the electromagnetic interference shield, the dielectric layer having an upper surface; a feeding element extending from the upper surface and electrically connected to the integrated circuit portion; and an antenna disposed on the upper surface and electrically connected to the feeding element.

Another aspect of the disclosure relates to manufacturing methods. In one embodiment, a manufacturing method includes a method of making a semiconductor package, comprising forming, in an integrated circuit of a semiconductor die, a grounding segment; forming a conductive via in the semiconductor die useable as a grounding element; disposing an electromagnetic interference shield above an upper surface of a silicon substrate of the semiconductor die; connecting the electromagnetic interference shield to the grounding segment using the conductive via as the grounding element; forming a dielectric structure covering at least part of the electromagnetic interference shield; forming a second conductive via passing through the dielectric element and the silicon substrate useable as a feeding element; forming an antenna element adjacent to an upper surface of the dielectric structure; and connecting the antenna element to a semiconductor element using the second conductive via as the feeding element. The manufacturing steps involved for the electromagnetic interference shield and the antenna can be performed at a same manufacturing facility.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
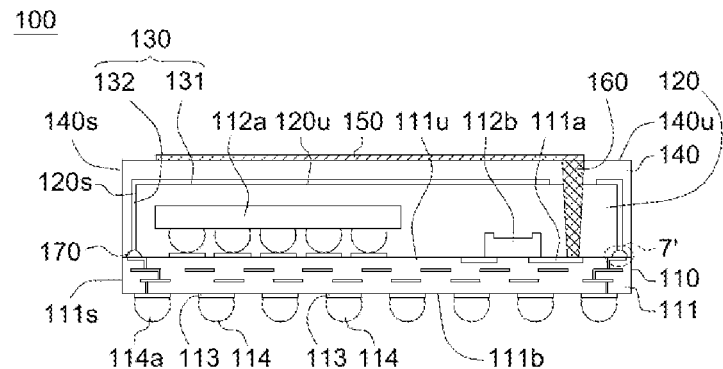
FIG. 1 illustrates a cross-sectional view of a semiconductor package according to an embodiment of the invention.

Referring to FIG. 1 a cross-sectional view of a semiconductor package 100, according to an embodiment of the invention, is illustrated. The semiconductor package 100 includes a, substrate 111, a semiconductor device 112a, a passive element 112b, a package body 120, an electromagnetic interference shielding element 130, a dielectric structure 140, an antenna element 150 and a feeding element 160. Advantageously, the semiconductor package 100 of the present embodiment of the invention can be manufactured entirely during a semiconductor packaging process, so that the antenna element 150 is concurrently formed therewith without employing extra antenna manufacturing facilities.

The substrate 111 includes an upper surface 111u, a lower surface 111b opposite to the upper surface 111u, and a lateral surface 111s at a periphery of the substrate 111. The lateral surface 111s extends between the upper surface 111u and the lower surface 111b, and circumscribes the substrate 111. The substrate 111 may be a multi-layered organic substrate or a ceramic substrate, for example.

In this embodiment, the semiconductor device 112a is coupled to the upper surface 111u of the substrate 111 in a "face-down" orientation and electrically connected to the substrate 111 via a plurality of solder balls. This configuration is sometimes referred to as "flip-chip". In other embodiments, the semiconductor device 112a may be coupled to the substrate 111 in a "face-up" orientation, and electrically connected to the substrate 111 via a plurality of conductive bond wires. The passive component 112b can include a resistor, an inductor or a capacitor. Alternatively, the semiconductor device 112a and passive component 112b may be embedded in the substrate 111.

The package body 120 is disposed over the upper surface 111u of the substrate 111 and encapsulates the semiconductor device 112a and passive component 112b. The package body 120 includes an upper surface 120u and a lateral surface 120s. The material of the package body 120 may include novolac-based resin, epoxy-based resin, silicone-based resin or other suitable encapsulant. The package body 120 may also include suitable fillers such as powdered silicon dioxide. The package body 120 can be formed by various packaging technologies, such as, for example, compression molding, injection molding or transfer molding.

The electromagnetic interference shielding element 130 substantially covers the lateral surface 120s and the upper surface 120u of the package body 120. The electromagnetic interference shielding element 130 includes a first conformal shielding film 131 and a grounding element 132, and provides electromagnetic interference shielding.

The first conformal shielding film 131 is directly formed on the upper surface 120u of the package body 120 and includes an opening. When the antenna element 150 is a patch antenna, the first conformal shielding film 131 can be used as a grounding structure for the antenna element 150. The first conformal shielding film 131 may include aluminum, copper, chromium, tin, gold, silver, nickel, stainless steel or any other suitable metal or alloy.

The grounding element 132 covers the lateral surface 120s of the package body 120 and electrically connects the first conformal shielding film 131 and the substrate 111, wherein the grounding element 132 is a second electromagnetic interference shielding film. The grounding element 132 and the first conformal shielding film 131 can be formed by the same material and integrally formed in one piece in the same manufacturing process or respectively formed in different manufacturing processes. The dielectric structure 140 covers the first conformal shielding film 131 and the grounding element 132 and includes an upper surface 140u. The dielectric structure 140 can be formed by a material such as a package body, a dielectric material (e.g., epoxy), or a prepreg lamination. The lateral surface 140s of the dielectric structure 140 is substantially flush or coplanar with the lateral surface 111s of the substrate 111.

The antenna element 150, formed adjacent to the upper surface 140u of the dielectric structure 140, extends in a direction substantially parallel to the first conformal shielding film 131. The antenna element 150 has several embodiments. The antenna element can be formed on a part of the upper surface of the dielectric structure 140, and the feeding element 160 can be partly or completely overlapped by the antenna element. In addition, the antenna element 150 and the semiconductor device 112a or the passive component 112b can be located on positions at different height levels, so that the required area of the upper surface 111u of the substrate 111 is reduced, and the required dimensions of the entire semiconductor package 100 are reduced.

The feeding element 160 in the present embodiment of the invention passes through the package body 120 and the dielectric structure 140. The feeding element 160 electrically connects the antenna element 150 and a feeding point 111a of the substrate 111. For example, the feeding element 160 of the present embodiment of the invention is a conductive pillar disposed in a grounded through hole providing electromagnetic interference protection. The feeding element 160 can also be realized by a conductive film, a conductive layer or a combination of the conductive layer and a resin (e.g., wherein the resin covers the conductive layer and fills up a space surrounded by the conductive layer, as hereinafter described).

The feeding point 111a can be realized by a pad, a solder point, a bump or a wire layer exposed from the substrate 111. The feeding point 111a may be located on the semiconductor device 112a, the passive element 112b or the substrate 111. The feeding element 160 is connected to the feeding point 111a. In the illustrated embodiment, the feeding point 111a is located on the substrate 111 and exposed from the upper surface 111u of the substrate 111.

The grounding segment 170 electrically connects the grounding element 132, and is located on one of the semiconductor device 112a, the passive element 112b and the substrate 111. In the present embodiment of the invention, the grounding segment 170 is located on the substrate 111. The grounding segment 170 can be realized by such as a pad, a solder point, a bump or a wire layer exposed from the substrate 111.

The semiconductor package 100 further includes a pad 113 and an electrical contact 114 disposed on the lower surface 111b, wherein the electrical contact 114, which can be realized by such as a solder ball, a conductive via or a bump, is formed on the pad 113. The electrical contact of the present embodiment of the invention is exemplified by a solder ball, illustrating that the semiconductor package 100 can be a ball grid array (BGA) structure. Alternatively, the electrical contact 114 can be omitted wherein the semiconductor package is a land grid array (LGA) structure. In addition, an electrical contact 114a of the electrical contacts 114 can be realized by such as a grounding contact, which is electrically connected to the grounding segment 170 through the substrate 111. The electrical contact 114a is electrically connected to the ground end of an external circuit element.

Figure 2:
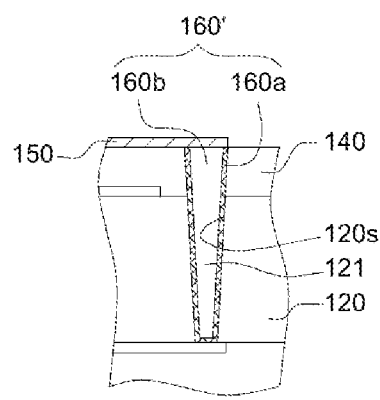
FIG. 2 illustrates a cross-sectional view of a feeding element according to an embodiment of the invention.

Referring to FIG. 2, a cross-sectional view of a feeding element according to another embodiment of the invention is illustrated. The feeding element 160' includes a conductive layer 160a and a resin 160b, wherein the resin 160b covers the conductive layer 160a and fills up the space surrounded by the conductive layer 160a. The package body 120 has a feeding through hole 121. The conductive layer 160a is disposed on the inner wall 120s of the corresponding feeding through hole 121, which passes through the package body 120 and dielectric structure 140. Then, the resin 160b is formed by an appropriate coating technique for covering the conductive layer 160a, and filling up the space surrounded by the conductive layer 160a so as to form the feeding element 160' of FIG. 2. The aforementioned coating technique can be realized by a printing, a plating, a spinning or a spraying process.

Figure 3:
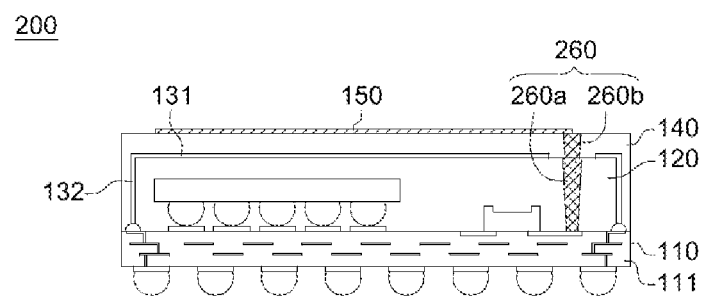
FIG. 3 illustrates a cross-sectional view of a semiconductor package according to an alternative embodiment of the invention.

Referring to FIG. 3, a cross-sectional view of a semiconductor package according to another embodiment of the invention is illustrated. The feeding element 260 of the semiconductor package 200 includes a first feeding sub-element 260a and a second feeding sub-element 260b, wherein the first feeding sub-element 260a passes through the package body 120, while the second feeding sub-element 260b passes through the dielectric structure 140. The first feeding sub-element 260a and the second feeding sub-element 260b can be separately formed in different manufacturing processes. Although the lower end area of the second feeding sub-element 260b is shown substantially smaller than the upper end area of the first feeding sub-element 260, it is to be understood that the lower end area of the second feeding sub-element 260b can be substantially larger than, or substantially equal to, the upper end area of the first feeding sub-element 260.

The first feeding sub-element 260a and the second feeding sub-element 260b can be structurally different. For instance the first feeding element 260a could be realized using a conductive pillar and the second feeding sub-element 260 could be realized using a conductive layer or a combination of a conductive layer and resin (such as how the feeding element shown in FIG. 2 is structured). As another example, the first feeding element 260a could be realized using a conductive layer or a combination of a conductive layer and the second feeding sub-element 260 could be realized using a conductive pillar.

Figure 4:
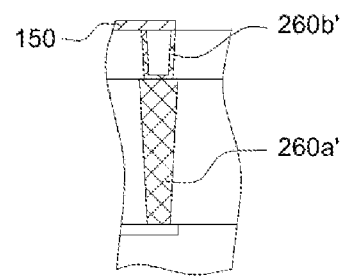
FIG. 4 illustrates a cross-sectional view of a first feeding sub-element and a second feeding sub-element according to an embodiment of the invention.

Referring to FIG. 4, a cross-sectional view of a first feeding sub-element and a second feeding sub-element according to another embodiment of the invention is illustrated. The first feeding sub-element 260a' is a conductive pillar, while the structure of the second feeding sub-element 260b' is similar to that of the feeding element 160' of FIG. 2, which is a combination of the conductive layer and the resin. In addition, the method of forming the first feeding sub-element 260a' is similar to that of the feeding element 160 of FIG. 1, and the method of forming the second feeding sub-element 260b' is similar to that of the feeding element 160' of FIG. 2.

Figure 5:
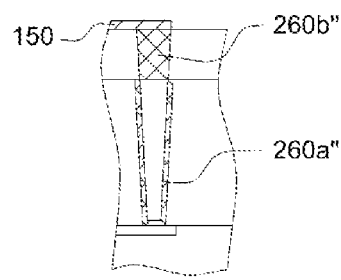
FIG. 5 illustrates a cross-sectional view of a first feeding sub-element and a second feeding sub-element according to an alternative embodiment.

Referring to FIG. 5, a cross-sectional view of a first feeding sub-element and a second feeding sub-element according to another embodiment is illustrated. The structure of the first feeding sub-element 260a" is similar to that of the feeding element 160' of FIG. 2, which is a combination of the conductive layer and the resin. The second feeding sub-element 260b" is a conductive via, and the method of forming the second feeding sub-element 260b" is similar to that of the feeding element 160 of FIG. 1.

Figure 6:
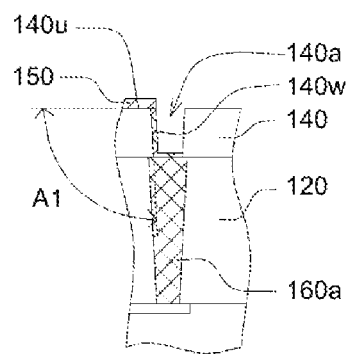
FIG. 6 illustrates a cross-sectional view of a feeding element according to an alternative embodiment of the invention.

Referring to FIG. 6, a cross-sectional view of a feeding element according to another embodiment of the invention is illustrated. The feeding element 160a can be realized by such as a conductive pillar. The dielectric structure 140 has an opening 140a from which the feeding element 160a is exposed and through which the antenna element 150 is connected to the feeding element 160. In the embodiment of FIG. 6, the dielectric structure 140 is a thin-type dielectric structure, so that the thickness is uniform at the bending of the antenna element 150; however, such exemplification not meant to be limiting. In another embodiment, the angle A1 between the inner wall 140w of the opening 140a and the upper surface 140u of the dielectric structure 140 can be increased to increase the slope of the inner wall 140w so that the thickness at the bending of the antenna element 150 is uniform. Moreover, by controlling the width of the opening 140a, the thickness of the antenna element 150 will become more uniform. Preferably but not restrictively, the ratio of the width of the opening 140a to the thickness of the dielectric structure 140 is smaller than or substantially equal to 1.5. For example, if the thickness of the dielectric structure 140 is 0.3 micrometer (um), then the width of the opening 140a ranges between 0.3~0.5 um.

Referring to FIG. 6, the antenna element 150 is connected to the feeding element 160a through the opening 140a, and a bending portion is formed. That is, the antenna element 150 is continuously disposed on the upper surface 140u of the dielectric structure, the inner wall 140w and the upper surface of the feeding element 160a, and the antenna element 150 directly contacts the feeding element 160a. Preferably but not restrictively, the dielectric structure 140 is realized by a prepreg lamination to form a thinner dielectric structure, so that the thickness of the antenna element 150 at the bending portion is uniform. In another embodiment, despite the dielectric structure 140 not being a thin-type dielectric structure, the thickness of the antenna element 150 at the bending portion still can be uniform by increasing the slope of the inner wall 140w of the opening 140a in the dielectric structure 140.

Figure 7:
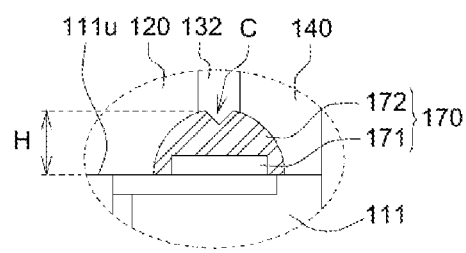
FIG. 7 illustrates an enlargement of the portion 7' of FIG. 1.

Referring to FIG. 7, an enlargement of the portion 7' of FIG. 1 is illustrated. The grounding segment 170 includes a grounding contact 171 and a protruded portion 172. The grounding contact 171 located on the upper surface 111u of the substrate 111 can be realized by a pad electrically connected to the substrate 111. In an embodiment, the grounding contact 171 can be realized by a pad, a solder point, a bump or a wire layer exposed from the substrate 111. The thickness of the grounding contact 171 ranges between 12~18 um or is within another numeric range. The protruded portion 172, realized by such as tin the solder point, covers the grounding contact 171 and is electrically connected to the grounding contact 171.

The protruded portion 172 as illustrated in FIG. 7 has a height H, and the grounding contact 171 will not be cut off by the cutting tool during the manufacturing process. That is, the formation of the protruded portion 172 avoids the grounding contact 171 being separated into two parts. In addition, a cutting tool passes through the protruded portion 172 and an indent C on the protruded portion 172 is formed. The indent C can be V-shaped. However, such exemplification is not meant to be limiting.

Figure 8:
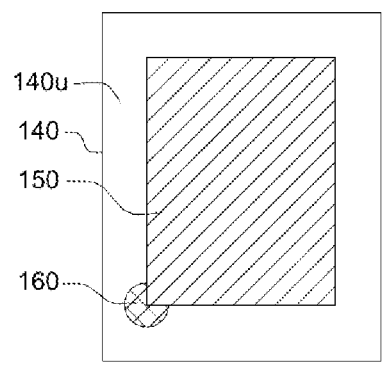
FIGS. 8-11 illustrate top views of an antenna element according to several embodiments of the invention.

Referring to FIG. 8, a top view of an antenna element according to one embodiment of the invention is illustrated. The antenna element 150 has a rectangular shape and is formed on a part of the upper surface 140u of the dielectric structure 140, while a part of the feeding element 160 is overlapped by the antenna element 150.

Figure 9:
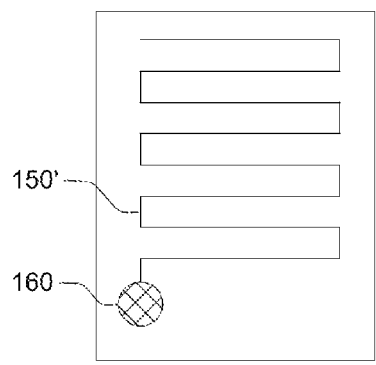

Referring to FIG. 9, the antenna element 150' is formed in a bending shape. However, in other embodiments, the antenna element 150' can be formed in one of a circular structure, a diamond structure and an S-shaped structure.

Figure 10:
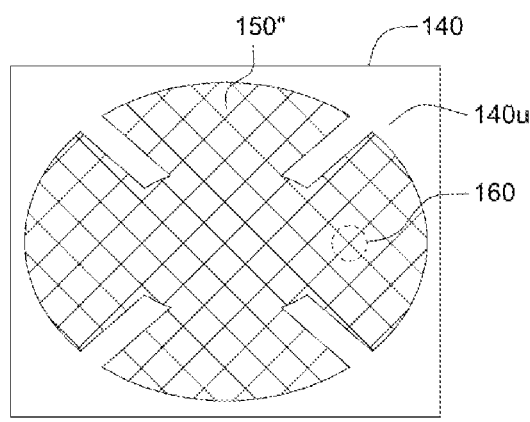

Referring to FIG. 10, the antenna element 150" is a patterned antenna structure formed on a part of the upper surface 140u of the dielectric structure 140, wherein the entire feeding element 160 is overlapped by the antenna element 150. However, the feeding element 160 can be partly overlapped by the antenna element 150.

Figure 11:
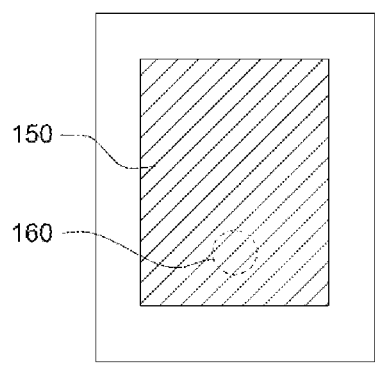

Referring to FIG. 11, the antenna element 150 is formed on a part of the upper surface 140u of the dielectric structure 140, and the entire feeding element 160 is overlapped by the antenna element 150. In addition, the antenna element 150 is formed by applying a metal layer by patterned foil, plating, sputtering or other similar processes. The antenna element 150 can be made from a material including a metal such as aluminum, copper, chrome, tin, gold, silver, nickel, stainless steel, or a combination thereof.

Figure 12:
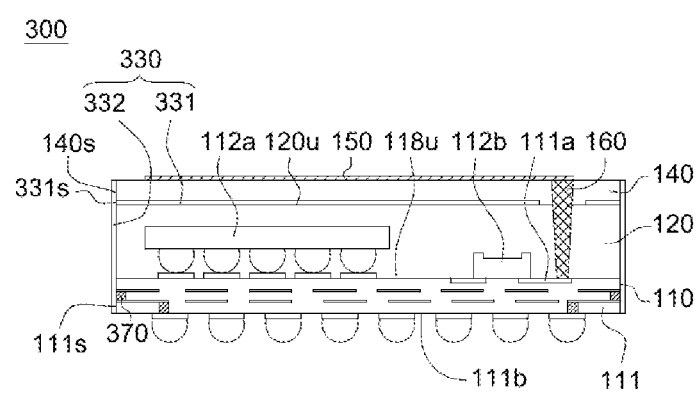
FIG. 12 illustrates a cross-sectional view of a semiconductor package according to an alternative embodiment of the invention.

Referring to FIG. 12, a cross-sectional view of a semiconductor package according to an embodiment of the invention is illustrated. The semiconductor package 300 includes the substrate 111, the semiconductor device 112a, the passive element 112b, the package body 120, an electromagnetic interference shielding element 330, the dielectric structure 140, the antenna element 150 and the feeding element 160. The semiconductor device 112a and the passive element 112b are disposed on the upper surface 111u of the substrate 111 and electrically connected to the substrate 111. The package body 120 encapsulates the semiconductor device 112a and the passive element 112b and has an upper surface 120u. The electromagnetic interference shielding element 330 includes a first conformal shielding film 331 and a grounding element 332.

The grounding element 332, realized by such as a second electromagnetic interference shielding film, covers a lateral surface 120s of the package body 120, the lateral surface 111s of the substrate 111, a lateral surface 140s of the dielectric structure 140 and the lateral surface 331s of the first conformal shielding film 331. In addition, the lateral surface 120s of the package body 120, the lateral surface 111s of the substrate 111 and the lateral surface 140s of the dielectric structure 140 are substantially flush or coplanar with one another.

The semiconductor package 300 further includes a grounding segment 370 disposed in the substrate 111 and exposed from the lateral surface 111s of the substrate 111, so that the grounding element 332 can electrically contact the grounding segment 370. In addition, the lateral surface of the grounding segment 370 is substantially flush or coplanar with the lateral surface 111s of the substrate 111. The grounding segment 370 can be extended between the upper surface 111u and the lower surface 111b of the substrate 111. As illustrated in FIG. 12, the grounding segment 370 is embedded in the substrate 111 and is exposed from the lateral surface 111s of the substrate 111 without penetrating the substrate 111. In an alternative embodiment, the grounding segment 370 can be extended from the upper surface 111u to the lower surface 111b, that is, the grounding segment 370 can penetrate the entire first substrate 111.

Figure 13:
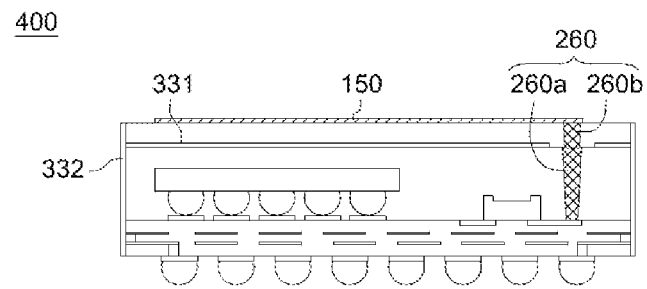
FIG. 13 illustrates a cross-sectional view of a semiconductor package according to an alternative embodiment of the invention.

Referring to FIG. 13, a cross-sectional view of a semiconductor package according to an alternative embodiment of the invention is illustrated. The feeding element of the semiconductor package 400 is formed as the feeding element 260 illustrated in FIG. 3, that is, the feeding element includes the first feeding sub-element 260a and the second feeding sub-element 260b.

Figure 14:
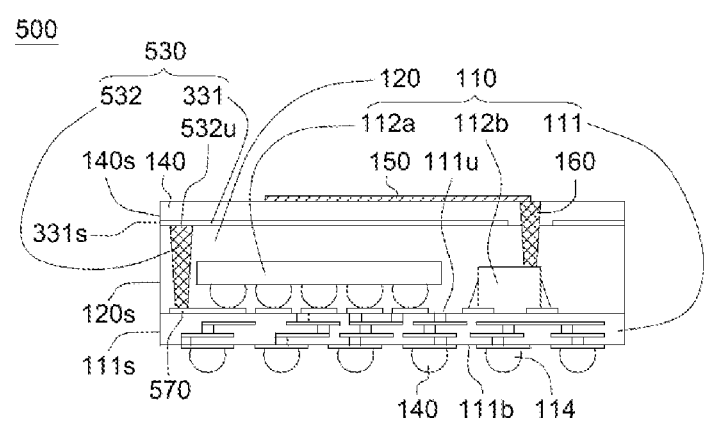
FIG. 14 illustrates a cross-sectional view of a semiconductor package according to an alternative embodiment of the invention.

Referring to FIG. 14, a cross-sectional view of a semiconductor package according to an embodiment of the invention is illustrated. The semiconductor package 500 includes, the first substrate 111, the semiconductor device 112a, the passive element 112b, an electromagnetic interference shielding element 530, the dielectric structure 140, the antenna element 150 and the feeding element 160. The semiconductor device 112a and the passive element 112b are disposed on the upper surface 111u of the substrate 111 and electrically connected to the substrate 111. The package body 120 of the semiconductor package 500 encapsulates the semiconductor 112a and the passive element 112b. The electromagnetic interference shielding element 530 includes a first conformal shielding film 331 and a grounding element 532. Alternatively, more than one grounding element 532 can be provided. In that case, the grounding elements 532 may be disposed adjacent to the peripheral of the region in which the semiconductor device 112a is disposed and surrounds the semiconductor device 112a so as to reduce or eliminate electromagnetic radiation.

The grounding element 532 of the semiconductor package 500 passes through the package body 120. The grounding element 532, realized by such as a conductive pillar, electrically connects the first conformal shielding film 331 and the grounding segment 570 on the substrate 111, wherein the grounding segment 570 is exposed from the upper surface 111u of the substrate 111. In the present embodiment of the invention, the first conformal shielding film 331 covers the upper surface 532u of the grounding element 532. In an embodiment, the first conformal shielding film 331 covers a lateral surface of the grounding element 532, while the upper surface 532u of the grounding element 532 is exposed from the first conformal shielding film 331. Alternatively, the grounding element 532 may be a plated via passing through the package body 120 with a conductive layer disposed on the inner wall thereof.

The feeding element 160 of the semiconductor package 500, which may be realized by a conductive pillar, electrically connects the antenna element 150 and the passive component 112b. In an embodiment, the feeding element 160 can also connect the antenna element 150 and the substrate 111, and is thus similar to the feeding element 160 of FIG. 1. Alternatively, the structure of the feeding element 160 of the semiconductor package 500 can also be similar to that of the feeding element of one of FIGS. 2 to 6.

The lateral surface 120s of the package body 120, the lateral surface 111s of the substrate 111, the lateral surface 140s of the dielectric structure 140 and the lateral surface 331s of the first conformal shielding film 331 are substantially flush or coplanar with one another.

Figure 15:
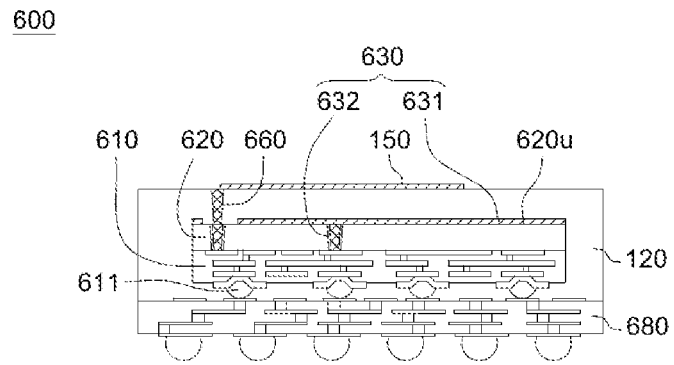
FIGS. 15-20 illustrate cross-sectional views of a semiconductor package according to other embodiments of the invention.

Referring to FIG. 15, a cross-sectional view of a semiconductor package according to another embodiment of the invention is illustrated. The semiconductor package 600 includes a flip chip type semiconductor die, an electromagnetic interference shielding element 630, a package body 120, an antenna element 150, and a feeding element 660. The flip chip type semiconductor die includes an integrated circuit 610 and a silicon substrate 620, wherein the integrated circuit 610 is formed on the silicon substrate 620 and the silicon substrate 620 has an upper surface 620u. The integrated circuit 610 may include one or more transistors, diodes, inductors, capacitors, resistors, and other circuit elements. In addition, a plurality of electrical contacts is formed on contact pads of the integrated circuit 610.

The electromagnetic interference shielding element 630 of the semiconductor package 600 includes a first conformal shield 631 and a grounding element 632. The first conformal shield 631 covers the upper surface 620u of the silicon substrate 620. The grounding element 632 is realized by a through-silicon via (TSV), wherein the through-silicon via can be formed by creating an opening in the silicon substrate 620 and filling the opening with conductive material. The grounding element 632 penetrates the silicon substrate 620, and electrically connects the first conformal shield 631 and the integrated structure 610.

The feeding element 660 penetrates the package body 120 as well as the silicon substrate 620, and electrically connects the antenna element 150 and the integrated circuit 610. As illustrated in FIG. 15, the feeding element 660 includes a conductive via formed in a through-hole disposed in the package body 120. The through-hole is formed by creating an opening in the package body 120, by for example laser drilling, and filling the opening with conductive material. Alternatively, the structure of the feeding element 660 of the semiconductor package 600 can also be similar to that of the feeding element of one of FIGS. 2 to 6.

The package body 120 of the semiconductor package 600 encapsulates the integrated circuit 610 and the silicon substrate 620. The semiconductor package further includes a second substrate 680, which is electrically connected to the integrated circuit 610 through the solder bumps 611. The structure and material of the second substrate 680 are similar to that of the first substrate 111, and the similarities are not repeated here.

Figure 16:
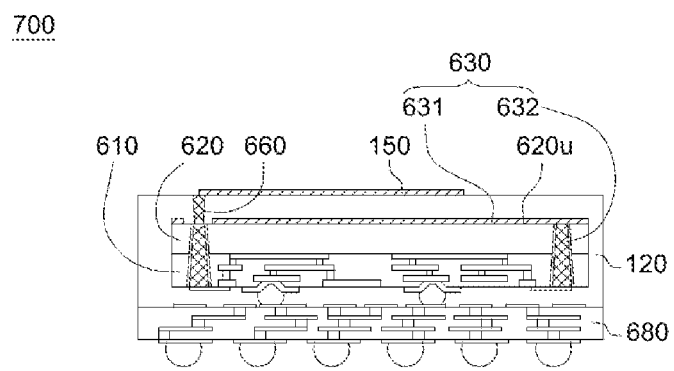

Referring to FIG. 16, a cross-sectional view of a semiconductor package 700 according to another embodiment of the invention is illustrated. The difference lies in that the grounding element 632 and the feeding element 660 pass through both the integrated circuit 610 and the silicon substrate 620. In addition, the feeding element 660 further passes through the package body 120 and directly contacts the antenna element 150.

Figure 17:
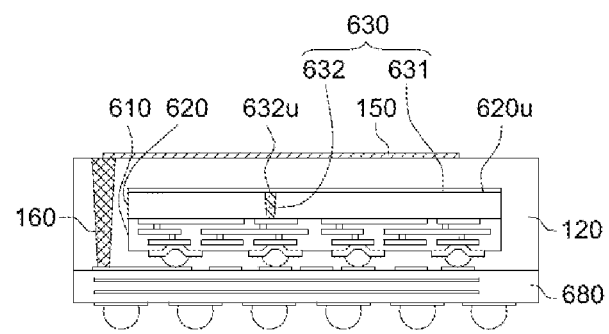

Referring to FIG. 17, a cross-sectional view of a semiconductor package 800 according to another embodiment of the invention is illustrated. The first conformal shield 631 of the semiconductor package 800 covers the upper surface 620u of the silicon substrate 620 and directly contacts the upper surface 632u of the grounding element 632. In an embodiment, the upper surface 632u of the grounding element 632 may be exposed from the first conformal shield 631, instead of being covered by the first conformal shield 631. The feeding element 160 passes through the package body 120 and electrically connects the antenna element 150 and the integrated circuit 610 through the circuit layout of second substrate 680. Alternatively, the structure of the feeding element 160 of the semiconductor package 800 may also be similar to that of the feeding element in one of FIGS. 2 to 6.

Figure 18:
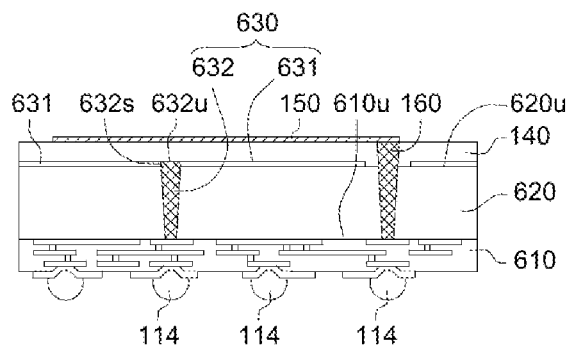

Referring FIG. 18, a cross-sectional view of a semiconductor package 900 according to another embodiment of the invention is illustrated. The semiconductor package 900 includes an integrated circuit 610, a silicon substrate 620, an electromagnetic interference shielding element 630, a dielectric structure 140, an antenna element 150 and a feeding element 160. The semiconductor package 900 of the present embodiment of the invention can be realized by a semiconductor wafer level chip scale package (WLCSP) integrated with an antenna structure, wherein the integrated circuit 610 may include one or more transistors, diodes, inductors, capacitors, resistors, and other circuit elements. As illustrated in FIG. 18, the semiconductor package 900 further includes a plurality of solder bumps, wherein the solder bumps may be connected to the integrated circuit 610 through contact pads or through a redistribution layer.

The electromagnetic interference shielding element 630 includes a first conformal shield 631 and a grounding element 632. The grounding element 632 can be realized by a conductive through-silicon via (TSV), electrically connecting the first conformal shield 631 and the integrated circuit 110. That is, the grounding element 632 can be formed by creating an opening in the silicon substrate 620 and filling the opening with conductive material, wherein the opening extends from the upper surface 620u of the silicon substrate 620 to a surface of the silicon substrate 620 (the surface with the integrated circuit formed thereon). In the present embodiment of the invention, the first conformal shield 631 electrically contacts a lateral surface 632s of the grounding element 632, and the upper surface 632u of the grounding element 632 is exposed from the first conformal shielding film 631. That is, the first conformal shield 631 does not cover the upper surface 632u of the grounding element 632. In an embodiment, the first conformal shield 631 may cover a part of the upper surface 632u of the grounding element 632. The feeding element 160 passes through both the package body 120 and the silicon substrate 620 to electrically connect the antenna element 150 and the integrated circuit 110. Alternatively, the structure of the feeding element 160 of the semiconductor package 800 may also be similar to that of the feeding element of one of FIGS. 2 to 6. In addition, the dielectric structure 140 covers the upper surface 620u of the silicon substrate 620.

Figure 19:
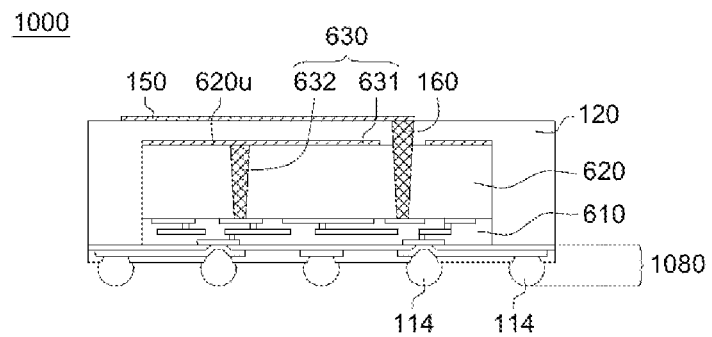

Referring to FIG. 19, a cross-sectional view of a semiconductor package according to another embodiment of the invention is illustrated, wherein the semiconductor package 1000 is a fan-out wafer level package (FOWLP). The semiconductor package 1000 includes a semiconductor die, an electromagnetic interference shielding element 630, a package body 120, an antenna element 150 and a feeding element 160. The semiconductor die includes an integrated circuit 610 and a silicon substrate 620, wherein the integrated circuit 610 may include one or more transistors, diodes, inductors, capacitors, resistors, and other circuit elements.

The electromagnetic interference shielding element 630 includes a first conformal shield 631 and a grounding element 632. The first conformal shield 631 covers the upper surface 620u of the silicon substrate 620. The semiconductor package 1000 further includes a redistribution layer 1080 electrically connected to the integrated circuit 610. The redistribution layer 1080 is formed after the integrated circuit 610 and the silicon substrate 620 are encapsulated by the package body 120. Therefore, the package body 120 encapsulates the integrated circuit 610, the silicon substrate 620 and a part of the redistribution layer 1080.

Figure 20:
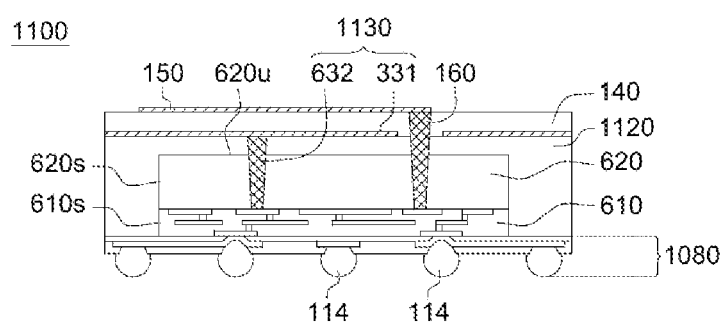

Referring to FIG. 20, a cross-sectional view of a semiconductor package according to another embodiment of the invention is illustrated, wherein the semiconductor package 1100 may be a fan-out wafer level package (FOWLP). The semiconductor package 1100 includes a semiconductor die, an electromagnetic interference shielding element 1130, a dielectric structure 140, an antenna element 150 and a feeding element 160. The semiconductor die includes an integrated circuit 610 and a silicon substrate 620, wherein the integrated circuit 610 may include one or more transistors, diodes, inductors, capacitors, resistors and other circuit elements. The semiconductor package 1100 further includes a package body 1120, which covers the upper surface 620u and a lateral surface 620s of the silicon substrate 620 as well as a lateral surface 610s of the integrated circuit 610.

The electromagnetic interference shielding element 1130 includes a first conformal shielding film 331 and a grounding element 632, wherein the first conformal shielding film 331 is formed on the package body 1120 and covered by the dielectric structure 140. The grounding element 632 is a conductive through-hole disposed in the package body 1120 and extending from the upper surface 620u of the silicon substrate 620 to the other surface (the surface with the integrated circuit 610 formed thereon) of the silicon substrate 620. That is, the grounding element 632 passes through the package body 1120 and the silicon substrate 620 to electrically connect the first conformal shielding film 331 and the integrated circuit 610.

The feeding element 160 passes through the dielectric structure 140, the package body 1120 and the silicon substrate 620 to electrically connect the antenna element 150 and the integrated circuit 610, wherein the feeding element 160 directly contacts the antenna element 150. Alternatively, the structure of the feeding element 160 of the semiconductor package 1100 can also be similar to that of the feeding element of one of FIGS. 2 to 6.

Referring to FIGS. 21A~21I, manufacturing processes according to the semiconductor package 100 of FIG. 1 are illustrated.

Figure 21A:
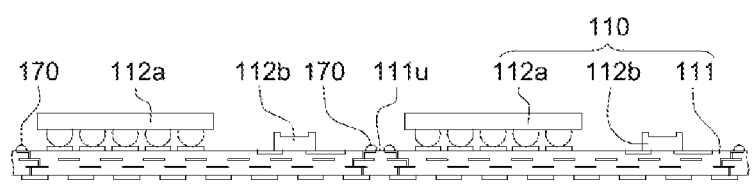
FIGS. 21A-21I illustrate manufacturing processes according to the semiconductor package of FIG. 1.

Referring to FIG. 21A, a semiconductor device 112a and passive component 112b are disposed adjacent to the upper surface 111u of the first substrate 111 using, for example, surface mount technology (SMT). The first substrate 111 includes a grounding segment 170.

Figure 21B:
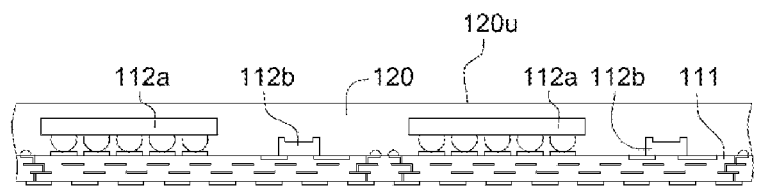

Referring to FIG. 21B, a package body 120 encapsulating the semiconductor element is formed on the upper surface 111u of the first substrate 111, wherein the package body 120 has an upper surface 120u.

Figure 21C:
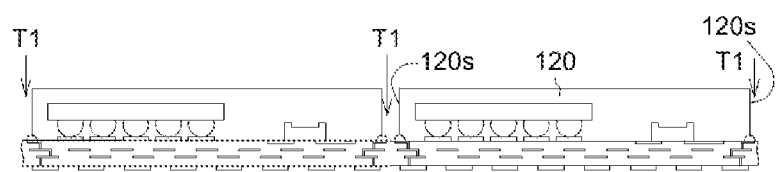

Referring to FIG. 21C, a first singulation path T1 is formed, wherein the first singulation path T1 passes through the package body 120. The first singulation paths T1 is formed using an appropriate laser or other cutting tool, and a lateral surface 120s is thereupon formed on the package body 120. In an embodiment, the first singulation path T1 may pass through a part of the first substrate 111. In the present embodiment of the invention, the singulation method is a half-cut method, that is, the first singulation path T1 does not cut off the first substrate 111.

Figure 21D:
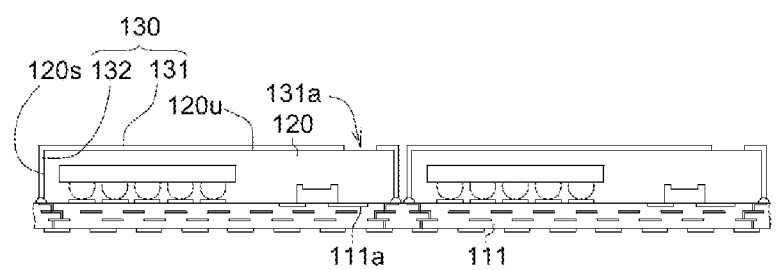

Referring to FIG. 21D, an electromagnetic interference shielding element 130 including a first conformal shielding film 131 and a grounding element 132 is formed. The electromagnetic interference shielding element 130 can be realized by material formation technology such as chemical vapor deposition, electroless plating, electrolytic plating, printing, spinning, spraying, sputtering, or vacuum deposition. In the present embodiment of the invention, the first conformal shielding film 131 and the grounding element 132 are integrally formed in one piece in the same manufacturing process. However, such exemplification is not meant to be limiting.

In FIG. 21D, the first conformal shielding film 131 covers the upper surface 120u of the package body 120. The first conformal shielding film 131 has an opening 131a from which a part of the package body 120 is exposed. The position of the opening 131a corresponds to the feeding point 111a, that is, the opening 131a is located right above the feeding point 111a. In the present embodiment of the invention, the feeding point 111a is formed adjacent to the upper surface 111u of the first substrate 111. In an embodiment, the feeding point 111a can also be located in the semiconductor device 112a or the passive component 112b. The grounding element 132 is a second electromagnetic interference shielding film, which is connected to the first conformal shielding film 131 and the grounding segment 170 and covers a lateral surface 120s of the package body 120.

Figure 21E:
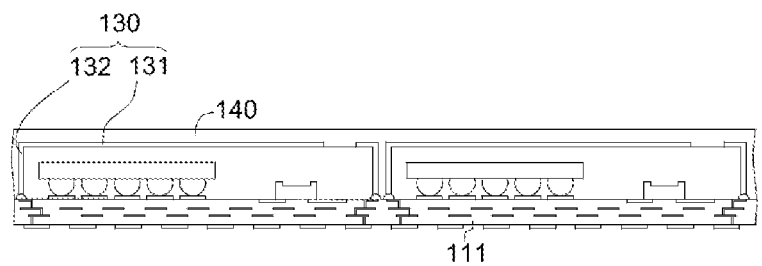

Referring to FIG. 21E, a dielectric structure 140 covering the first conformal shielding film 131, the grounding element 132 and the exposed upper surface of the first substrate 111 is formed. The dielectric structure 140 may be formed using any known packaging technology or laminate technology.

Figure 21F:
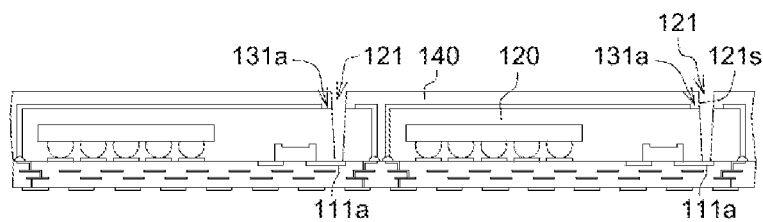

Referring to FIG. 21F, a feeding through hole 121 penetrating the package body 120 and the dielectric structure 140 is formed. The feeding through hole 121 passes through the dielectric structure 140, the opening 131a and the package body 120 and exposes the feeding point 111a. The patterning technology for forming the feeding through hole 121 can include photolithography, chemical etching, laser drilling, or mechanical drilling.

Figure 21G:
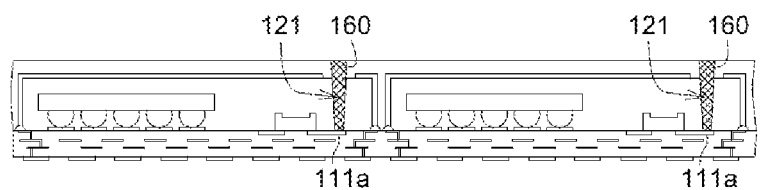

Referring to FIG. 21G, a feeding element 160 is formed by filling the feeding through hole 121 with conductive material by plating, solder paste or other forms of applying conductive material. The feeding element 160 extends from the upper surface 140u of the dielectric structure 140 and is electrically connected to the feeding point 111a.

Figure 21H:
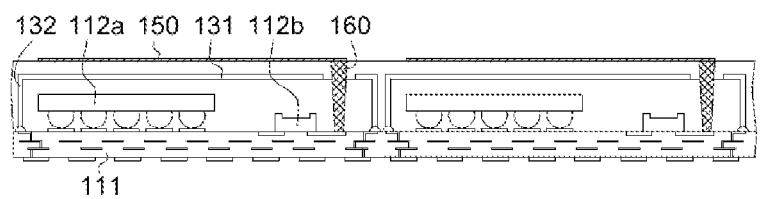

Referring to FIG. 21H, an antenna element 150 is formed on the upper surface 140u of the dielectric structure 140 and directly contacts the feeding element 160, so that the antenna element 150 electrically connects the circuit structure 110 through the feeding element 160. The antenna element 150 can be formed as described above to include plating/etching photolithographic processes.

Figure 21I:
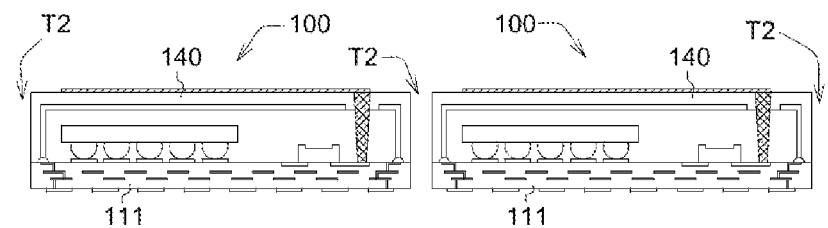

Referring to FIG. 21I, a number of second singulation paths T2 passing through the dielectric structure 140 and the entire first substrate 111 are formed. For example, a second singulation path T2 is formed by such as a laser or other cutting tool. In addition, before or after the second singulation path T2 is formed, an electrical contact 114 may be formed adjacent to the lower surface 111b of the first substrate 111 so as to form the semiconductor package 100 illustrated in FIG. 1.

Referring to FIGS. 22A~22D, manufacturing processes according to the semiconductor package of FIG. 3 are illustrated.

Figure 22A:
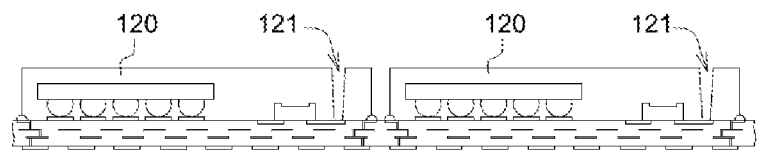
FIGS. 22A-22D illustrate manufacturing processes according to the semiconductor package of FIG. 3.

Referring to FIG. 22A, a feeding through hole 121 penetrating the package body 120 is formed.

Figure 22B:
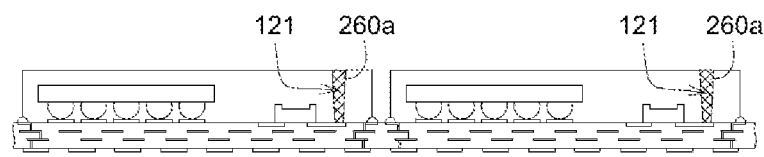

Referring to FIG. 22B, a first feeding sub-element 260a is formed by filling the feeding through hole 121 with conductive material.

Figure 22C:
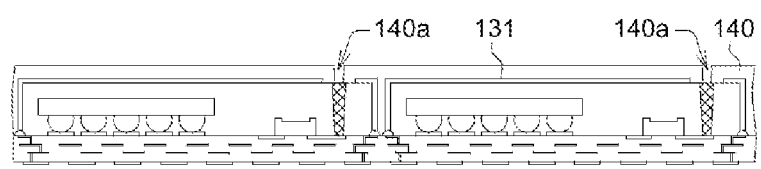

Referring to FIG. 22C, an electromagnetic interference shielding element 130 and a dielectric structure 140 are formed, and an opening 140a is formed on the dielectric structure 140, wherein the opening 140a exposes a corresponding first feeding sub-element 260a.

Figure 22D:
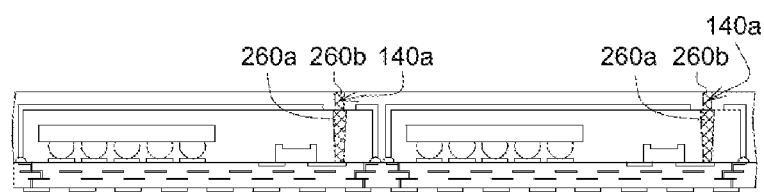

Referring to FIG. 22D, a second feeding sub-element 260b is formed by filling the corresponding opening 140a with conductive material, wherein the first feeding sub-element 260a and the second feeding sub-element 260b are combined as the feeding element 260 of FIG. 3.

Referring to FIGS. 23A~23F, manufacturing processes according to the semiconductor package of FIG. 12 are illustrated. The present embodiment of the invention adopts the full-cut method.

Figure 23A:
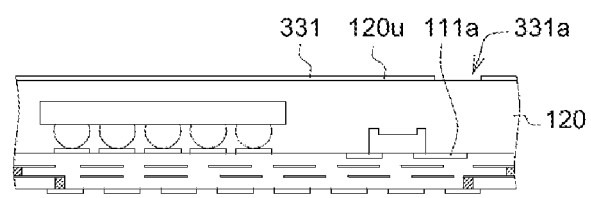
FIGS. 23A-23F illustrate manufacturing processes according to the semiconductor package of FIG. 12.

Referring to FIG. 23A, a first conformal shielding film 331 is formed on the upper surface 120u of the package body 120. The first conformal shielding film 331 has an opening 331a from which a part of the package body 120 is exposed, wherein the position of the opening 331a corresponds to the feeding point 111a.

Figure 23B:
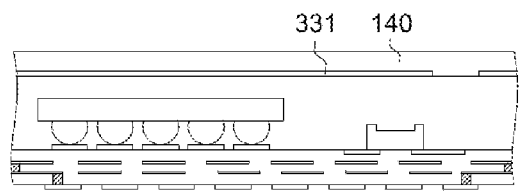

Referring to FIG. 23B, a dielectric structure 140 covering the first conformal shielding film 331 is formed.

Figure 23C:
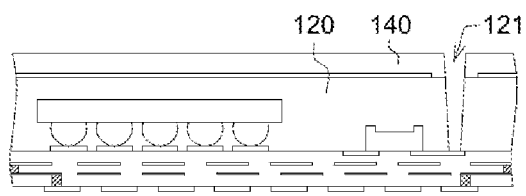

Referring to FIG. 23C, a feeding through hole 121 penetrating the dielectric structure 140 and the package body 120 is formed.

Figure 23D:
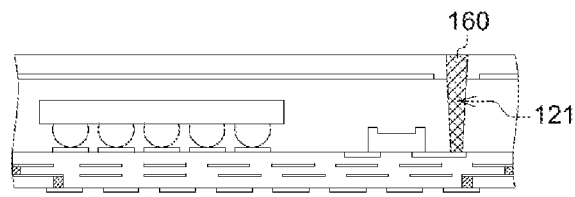

Referring to FIG. 23D, a feeding element 160 is formed by filling the feeding through hole 121 with conductive material. The feeding element 160 passes through the dielectric structure 140, the opening 331a and the package body 120.

Figure 23E:
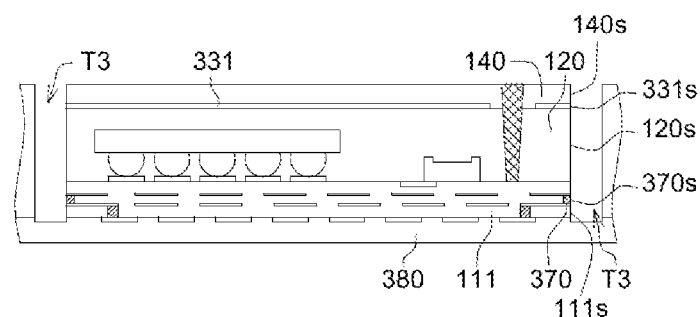

Referring to FIG. 23E, a first singulation path T3 passing through the package body 120, the dielectric structure 140, the first conformal shielding film 331 and the first substrate 111 is formed. Wherein, the lateral surface 120s of the package body 120, the lateral surface 111s of the first substrate 111, the lateral surface 140s of the dielectric structure 140, the lateral surface 331s of the first conformal shielding film 331 and the lateral surface 370s of the grounding segment 370 are substantially aligned with one another. In addition, the first substrate 111 can be adhered onto the carrier 380 before the first singulation path T3 is formed. The first singulation path T3 may pass through a part of the carrier 380 to completely cut off the package body 120, the dielectric structure 140, the first conformal shielding film 331 and the first substrate 111.

Figure 23F:
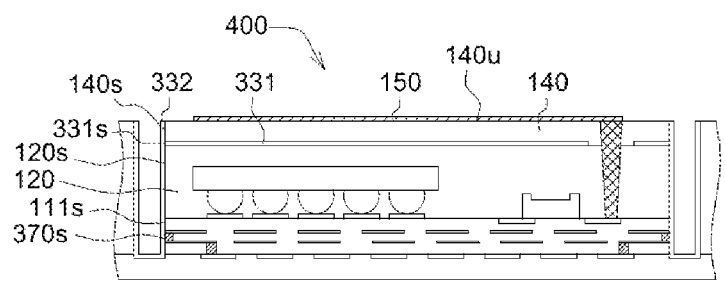

Referring to FIG. 23F, an antenna element 150 is formed on the upper surface 140u of the dielectric structure 140. A grounding element 332 covering the lateral surface 120s of the package body 120, the lateral surface 111s of the first substrate 111, the lateral surface 140s of the dielectric structure 140, the lateral surface 331s of the first conformal shielding film 331 and the lateral surface 370s of the grounding segment 370 is formed. After the carrier 380 is removed and the electrical contact 114 is disposed adjacent to the lower surface 111b of first substrate 111, the semiconductor package 300 as illustrated in FIG. 12 is formed.

Referring to FIGS. 24A~24F, manufacturing processes according to the semiconductor package of FIG. 14 are illustrated.

Figure 24A:
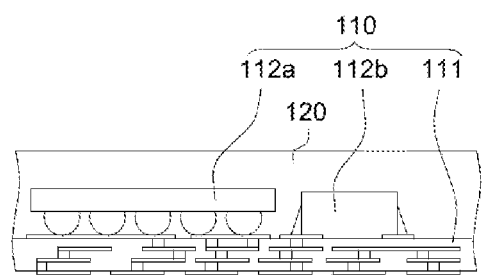
FIGS. 24A-24F illustrate manufacturing processes according to the semiconductor package of FIG. 14.

Referring to FIG. 24A, a semiconductor device 112a and a passive component 112b are disposed adjacent to the upper surface 111u of the first substrate 111 by such as surface mount technology (SMT). Then, a package body 120 is formed to cover the upper surface 111u of the first substrate 111, the semiconductor device 112a and the passive component 112b.

Figure 24B:
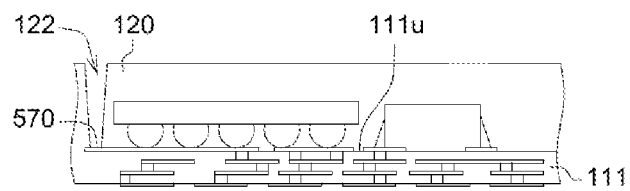

Referring to FIG. 24B, a grounding through hole 122 penetrating the package body 120 is formed. The grounding through hole 122 exposes the grounding segment 570. In an embodiment, the formation process of the grounding through hole 122 can be integrated with the formation process of the protection structure 120.

Figure 24C:
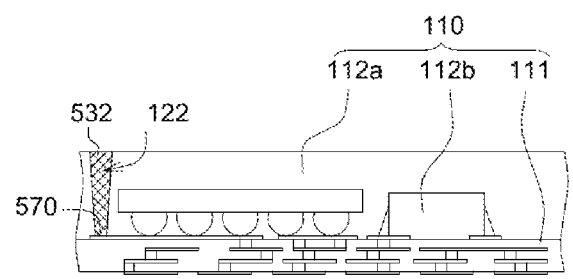

Referring to FIG. 24C, a grounding element 532 is formed by filling the grounding through hole 122 with conductive material, wherein the grounding element 532 is electrically connected to the grounding segment 570 on the first substrate 111.

Figure 24D:
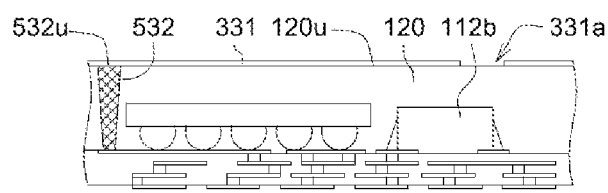

Referring to FIG. 24D, a first conformal shielding film 331 covering the upper surface 120u of the package body 120 is formed. The first conformal shielding film 331 has an opening 331a from which a part of the package body 120 is exposed, wherein the position of opening 331a corresponds to the semiconductor device 112a or the passive component 112b. In the present embodiment of the invention, the position of opening 331a corresponds to the passive component 112b. In FIG. 24D, the first conformal shielding film 331 directly contacts the upper surface 532u of the grounding element 532. However, in other embodiment, the grounding element 532 may be formed after the first conformal shielding film 331 is disposed on the upper surface 120u of package body, so that a part of the upper surface 532u of the grounding element 532 can be exposed from the first conformal shielding film 331.

Figure 24E:
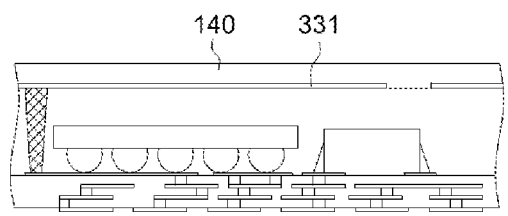

Referring to FIG. 24E, a dielectric structure 140 covering the first conformal shielding film 331 is formed.

Figure 24F:
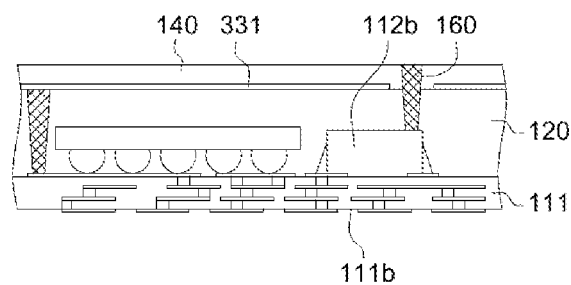

Referring to FIG. 24F, a feeding element 160 is formed by creating an opening passing through the package body 120 as well as the dielectric structure 140 and filling the opening with conductive material. In the present embodiment, the feeding element 160 is electrically connected to the passive component 112b. Then, the antenna element 150 as illustrated in FIG. 14 is formed on the dielectric structure 140 and directly contacts the feeding element 160. An electrical contact 114 as illustrated in FIG. 14 is disposed adjacent to the lower surface 111b of the first substrate 111. Then, a singulation path (not illustrated) is formed, wherein the singulation path passes through the dielectric structure 140, the package body 120, the first conformal shielding film 331 and the first substrate 111, to form a semiconductor package 500 as illustrated in FIG. 14. In an embodiment, the electrical contact 114 can be formed after the formation of the singulation path.

Referring to FIGS. 25A~25E, manufacturing processes according to the semiconductor package of FIG. 15 are illustrated.

Figure 25A:
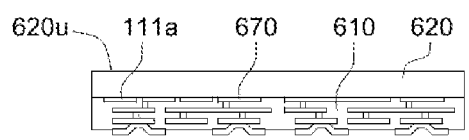
FIGS. 25A-25G illustrate manufacturing processes according to the semiconductor package of FIG. 15.

Referring to FIG. 25A, a semiconductor die including an integrated circuit 610 having an active surface and a silicon substrate 620 having an inactive surface are provided. The integrated circuit 610 may include one or more transistors, diodes, inductors, capacitors, resistors and other circuit elements, and a grounding segment 670 and a feeding point 111a is formed within the integrated circuit 610. In addition, a plurality of contact pads and a redistribution layer (not illustrated) may be disposed to be electrically connected to the integrated circuit 610. To reduce the thickness of the semiconductor die, a part of the silicon substrate 620 may be removed by grinding.

Figure 25B:
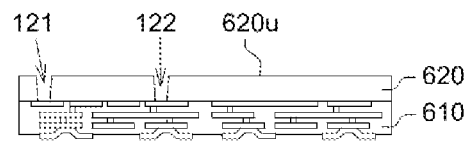

Referring to FIG. 25B, a feeding through hole 121 and a grounding through hole 122 (which may be a through silicon via) are formed in the silicon substrate 620, wherein the feeding through hole 121 and the grounding through hole 122 extend from a upper surface 620u of the silicon substrate 620 to a front surface (the surface with integrated circuit 610 formed thereon). For example, the feeding through hole 121 and the grounding through hole 122 may be formed by performing deep reactive-ion etching (RIE) on the silicon substrate 620. The feeding through hole 121 and the grounding through hole 122 are formed using a via-last approach, that is, the feeding through hole 121 and the grounding through hole 122 are formed after the formation of the integrated circuit 610.

Figure 25C:
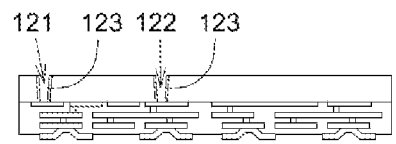
Figure 25D:
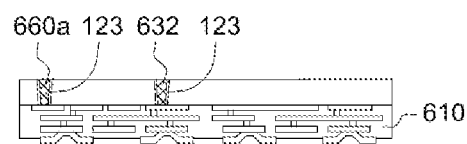

Referring to FIG. 25C, a seed layer 123 is formed on the wall of the feeding through hole 121 and the grounding through hole 122. The usable materials of the seed layer include copper or copper alloys. In an embodiment, the seed layer is formed using sputtering. In other embodiments, chemical vapor deposition (CVD) or electro plating may be used. Additionally, an annular insulation layer (not shown) may be formed in the feeding through hole 121 prior to the application of the seed layer 123. Referring to FIG. 25D, a grounding element 632 and a first feeding sub-element 660a are formed by filling respectively the grounding through hole 122 and feeding through hole 121 with conductive material such as Cu, Al, Sn, Ni, Au, or Ag. The grounding element 632 is electrically connected to the grounding segment 670 of the integrated circuit 610, and the first feeding sub-element 660a is electrically connected to the feeding point 111a of the integrated circuit 610. In addition, the grounding element 632 and the first feeding sub-element 660a can be concurrently formed in the same manufacturing process.

Figure 25E:
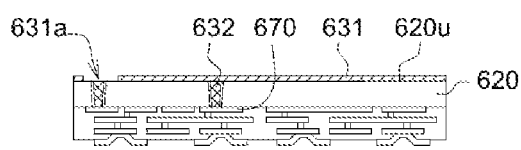

Referring to FIG. 25E, a first conformal shield 631 covering the upper surface 620u of the silicon substrate 620 is formed. After the first conformal shield 631 and the grounding element 632, shown in FIG. 25E as a via, are formed, the grounding element 632 providing a ground path that electrically connects the integrated circuit 610 and the first conformal shield 631. In addition, the first conformal shield 631 has an opening 631a from which the first feeding sub-element 660a is exposed, i.e. the feeding element 660 and the feeding sub-element 660a are electrically isolated from the first conformal shield 631.

Figure 25F:
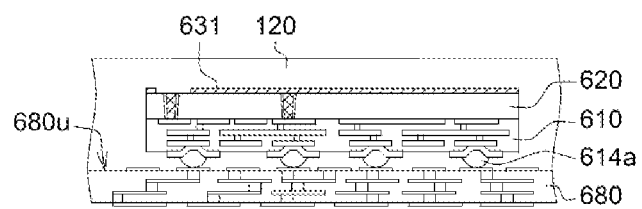

Referring to FIG. 25F, an electrical contact 614a is formed on the contact pad of the integrated circuit 610. Then, the semiconductor die is disposed adjacent to the upper surface 680u of the second substrate 680, wherein the integrated circuit 610 electrically connects the second substrate 680 through the electrical contact 614a. Then, a package body 120 encapsulating the first conformal shield 631, the upper surface 680u of the second substrate 680 and the semiconductor die is formed.

Figure 25G:
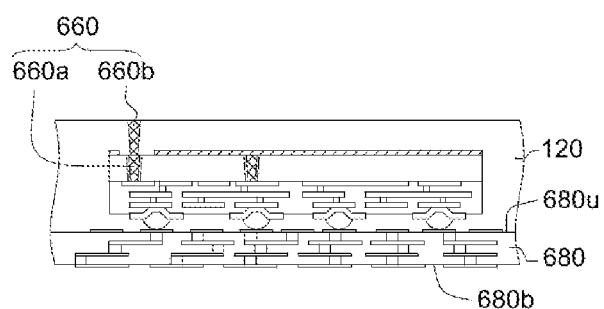

Referring to FIG. 25G, a second feeding sub-element 660b is formed, wherein the first feeding sub-element 660a and the second feeding sub-element 660b are combined to form a feeding element 660. In addition, the formation method of the second feeding sub-element 660b is similar to that of the second feeding sub-element 260b of FIG. 3, and the similarities are not repeated here. Then, the antenna element 150 as illustrated in FIG. 15 is formed on the package body 120, and a singulation path (not illustrated) passing through the package body 120 and the second substrate 680 is formed to produce a semiconductor package 600 as illustrated in FIG. 15. In an embodiment, an electrical contact 114 illustrated in FIG. 15 may be formed adjacent to the lower surface 680b of the second substrate 680 after or before the formation of the singulation path.

Referring to FIG. 25G, the first feeding sub-element 660a and the second feeding sub-element 660b are combined to form a feeding element 660. However, as illustrated in FIG. 17, the feeding element 660 may penetrate the package body 120 to be electrically connected to the antenna element 150 and the feeding point disposed on the second substrate 680.

Referring to FIGS. 26A~26E, manufacturing processes according to the semiconductor package of FIG. 15 are illustrated, wherein via-first approach is introduced.

Figure 26A:
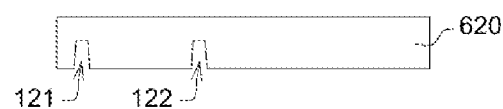
FIGS. 26A-26F illustrate manufacturing processes according to the semiconductor package of FIG. 15.

Referring to FIG. 26A, a silicon substrate 620 is provided and one feeding through hole 121 and grounding through hole 122 are formed in the silicon substrate 620. The feeding through hole 121 and the grounding through hole 122 may be formed by performing deep reactive-ion etching (RIE) or laser ablation on the silicon substrate 620.

Figure 26B:
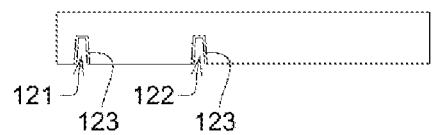

Referring to FIG. 26B, a thin seed layer 123 is formed on the wall of the feeding through hole 121 and the grounding through hole 122. The usable materials of the seed layer include copper or copper alloys. In an embodiment, the seed layer is formed using sputtering. In other embodiments, physical vapor deposition (PVD) or electro plating may be used.

Figure 26C:
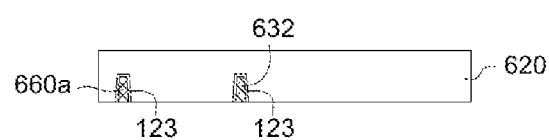

Referring to FIG. 26C, a grounding element 632 and a first feeding sub-element 660a are formed by filling the feeding through hole 121 and the grounding through hole 122 with conductive material such as Cu, Al, Sn, Ni, Au, or Ag.

Figure 26D:
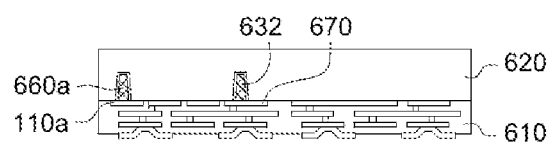

Referring to FIG. 26D, an integrated circuit 610 is formed to connect the silicon substrate. The integrated circuit 610 may include one or more transistors, diodes, inductors, capacitors, resistors and other circuit elements. A grounding segment 670 and a feeding point 111a are formed within the integrated circuit 610. In the present embodiment, the feeding through hole 121 and grounding through hole 122 are formed using a via-first approach, that is, the feeding through hole 121 and grounding through hole 122 are formed before the formation of the integrated circuit 610. The grounding element 632 is electrically connected to the grounding segment 670, and the first feeding sub-element 660a is electrically connected to the feeding point 111a. In addition, a plurality of contact pads and a redistribution layer (not illustrated) may be disposed to electrically connect the integrated circuit 610.

Figure 26E:
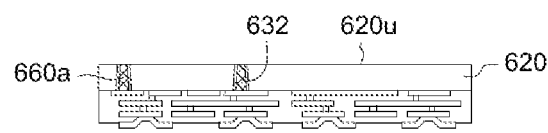

Referring to FIG. 26E, a part of the silicon substrate 620 is removed by grinding. The grounding element 632 and the first feeding sub-element 660a are exposed from the upper surface 620u of the silicon substrate 620.

Figure 26F:
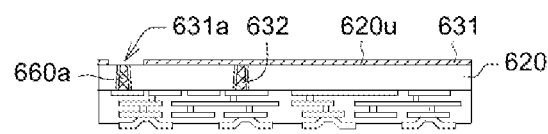

Referring to FIG. 26F, a first conformal shield 631 covering the upper surface 620u of the silicon substrate 620 is formed. After the first conformal shield 631 and the grounding element 632 are formed, the grounding element 632 electrically connects the integrated circuit 610 and the first conformal shield 631. In addition, the first conformal shield 631 has an opening 631a from which the first feeding sub-element 660a is exposed.

Figure 26G:
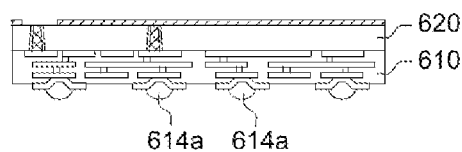

Referring to FIG. 26G, an electrical contact 614a is formed on the contact pad of the integrated circuit 610. Then, as illustrated in FIG. 15, the semiconductor die is disposed adjacent to the upper surface 680u of the second substrate 680, wherein the integrated circuit 610 electrically connects the second substrate 680 through the electrical contact 614a. Then, a dielectric structure 140 encapsulating the first conformal shield 631, the upper surface 680u of the second substrate 680 and the semiconductor die is formed. The following processes are similar to those of semiconductor 600, and the similarities are not repeated here.

Figure 27A:
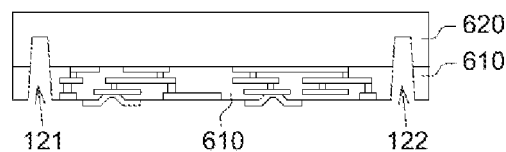
FIGS. 27A-27F illustrate manufacturing processes according to the semiconductor package of FIG. 16.

Referring to FIGS. 27A~27E, manufacturing processes according to the semiconductor package of FIG. 16 are illustrated Referring to FIG. 27A, a feeding through hole 121 and a grounding through hole 122 are formed in a silicon substrate 620 and an integrated circuit 610. That is, the feeding through hole 121 and the grounding through hole 122 extend from the surface of the integrated circuit 610 (the surface with the contact pad formed thereon) to the silicon substrate 610, but back ends of the feeding through hole 121 and the grounding through hole 122 are not exposed from the upper surface 620u of the silicon substrate 620. In the present embodiment, the feeding through hole 121 and the grounding through hole 122 may be formed by performing deep reactive-ion etching (RIE) on the integrated circuit 610. In another embodiment, the grounding through hole 122 may be formed by performing laser ablation on the silicon substrate 620.

Figure 27B:
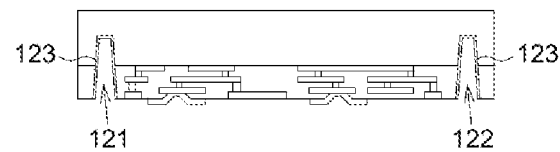

Referring to FIG. 27B, a thin seed layer 123 is formed on the wall of the feeding through hole 121 and grounding through hole 122. The usable materials of the seed layer include copper or copper alloys. In an embodiment, the seed layer is formed using sputtering. In other embodiments, physical vapor deposition (PVD) or electro plating may be used.

Figure 27C:
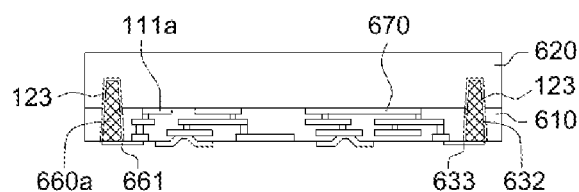

Referring to FIG. 27C, a grounding element 632 and a first feeding sub-element 660a are formed by filling respectively the grounding through hole 122 and the feeding through hole 121 with conductive material such as Cu, Al, Sn, Ni, Au, or Ag. The grounding element 632 is electrically connected to the grounding segment 670 of the integrated circuit 610 through a first metal layer 633, and the first feeding sub-element 660a is electrically connected to the feeding point 111a of the integrated circuit 610 through a second metal layer 661. In addition, the grounding element 632 and the first feeding sub-element 660a can be concurrently formed in the same manufacturing process.

Figure 27D:
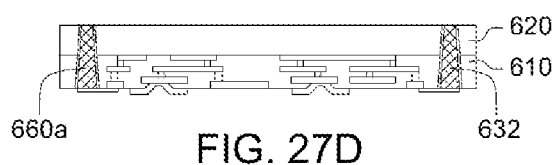

Referring to FIG. 27D, a part of the silicon substrate 620 is removed by grinding, and back ends of the grounding element 632 and the first feeding sub-element 660a are therefore exposed from the upper surface 620u of the silicon substrate 620.

Figure 27E:
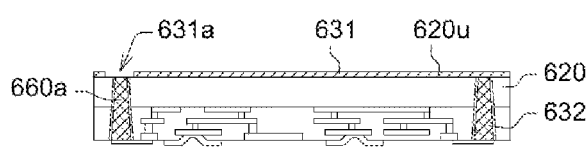

Referring to FIG. 27E, a first conformal shield 631 covering the upper surface 620u of the silicon substrate 620 is formed. After the first conformal shield 631 and the grounding element 632 are formed, the grounding element 632 electrically connects the integrated circuit 610 and the first conformal shield 631. In addition, the first conformal shield 631 has an opening 631a from which the first feeding sub-element 660a is exposed.

Figure 27F:
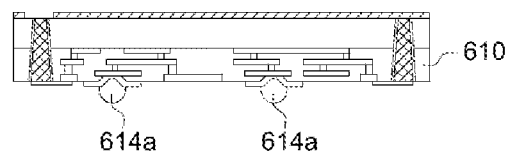

Referring to FIG. 27F, an electrical contact 614a is formed on the contact pad of the integrated circuit 610. Then, as illustrated in FIG. 16, the semiconductor die is disposed adjacent to the upper surface 680u of the second substrate 680, wherein the integrated circuit 610 electrically connects the second substrate 680 through the electrical contact 614a. Then, a dielectric structure 140 encapsulating the first conformal shield 631, the upper surface 680u of the second substrate 680 and the semiconductor die is formed. Then, a second feeding sub-element 660b is formed, wherein the first feeding sub-element 660a and the second feeding sub-element 660b are combined to form a feeding element 660. Then, the antenna element 150, as illustrated in FIG. 16, is formed on the dielectric structure 140, and a singulation path (not illustrated) passing through the dielectric structure 140 and the second substrate 680 is formed to produce the semiconductor package 700 as illustrated in FIG. 16.

Referring to FIGS. 28A~28E, manufacturing processes according to the semiconductor package of FIG. 18 are illustrated.

Figure 28A:
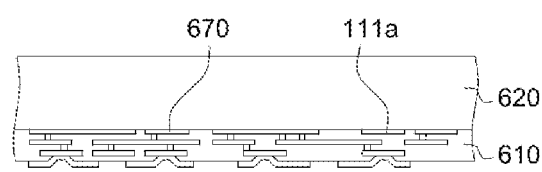
FIGS. 28A-28E illustrate manufacturing processes according to the semiconductor package of FIG. 18.

Referring to FIG. 28A, a semiconductor die including an integrated circuit 610 and a silicon substrate 620 is provided. The integrated circuit 610 may include one or more transistors, diodes, inductors, capacitors, resistors and other circuit elements. A grounding segment 670 and a feeding point 111a is formed within the integrated circuit 610. In addition, a plurality of contact pads and a redistribution layer (not illustrated) are disposed on the integrated circuit 610.

Figure 28B:
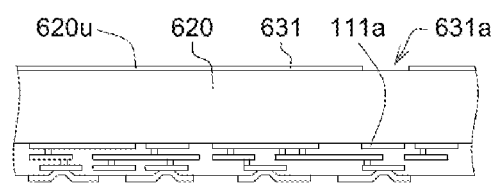

Referring to FIG. 28B, a first conformal shield 631 covering the upper surface 620u of the silicon substrate 620 is formed. The first conformal shield 631 has an opening 631a from which a part of the silicon substrate 620 is exposed, wherein the position of the opening 631a corresponds to the feeding point 111a.

Figure 28C:
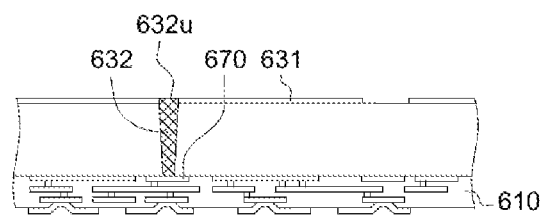

Referring to FIG. 28C, a grounding element 632 is formed by forming one grounding through hole 122 in the silicon substrate 620 of semiconductor die and filling the grounding through hole 122 with conductive material. The first conformal shield 631 covers a lateral surface of the grounding element 632, and the upper surface 632u of the grounding element 632 is exposed from the first conformal shield 631. The grounding element 632 is electrically connected to the integrated circuit 610 and the first conformal shield 631.

Figure 28D:
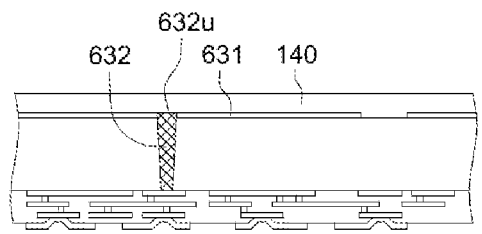

Referring to FIG. 28D, a dielectric structure 140 covering the first conformal shield 631 and the upper surface 632u of the grounding element 632 is formed.

Figure 28E:
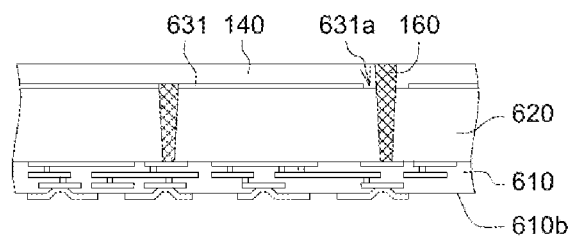

Referring to FIG. 28E, the feeding element 160 is formed by forming a feeding through hole 121 passing through the dielectric structure 140, the opening 631a and the silicon substrate 620, and then filling the feeding through hole 121 with conductive material, wherein the feeding element 160 is electrically connected to the integrated circuit 610. Then, the antenna element 150, illustrated in FIG. 18, is formed on the dielectric structure 140, wherein the antenna element 150 directly contacts the feeding element 160. Then, an electrical contact 140, as illustrated in FIG. 18, is formed adjacent to the lower surface 610b of the circuit structure 610. A singulation path (not illustrated) passing through the dielectric structure 140, the first conformal shield 631, the silicon substrate 620 and the integrated circuit 610 is then formed to produce the semiconductor package 900 as illustrated in FIG. 18. In an embodiment, the electrical contact 140 can be formed before or after the formation of the singulation path.

Referring to FIGS. 29A~29D, manufacturing processes according to the semiconductor package of FIG. 19 are illustrated.

Figure 29A:
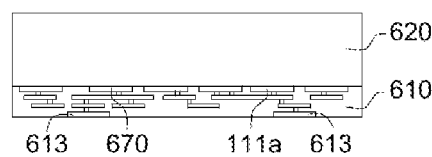
FIGS. 29A-29D illustrate manufacturing processes according to the semiconductor package of FIG. 19.

Referring to FIG. 29A, a semiconductor die including the integrated circuit 610 and the silicon substrate 620 is provided. The integrated circuit 610 may include one or more transistors, diodes, inductors, capacitors, resistors, and a grounding segment 670. The feeding point 111a is formed within the integrated circuit 610.

Figure 29B:
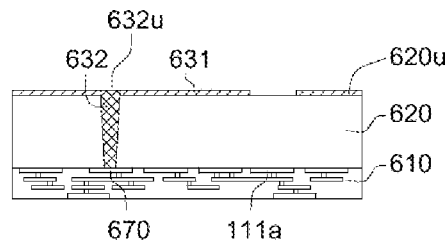

Referring to FIG. 29B, the grounding element 632 is produced by forming an opening in the silicon substrate 620 and filling the opening with conductive material. Then, the first conformal shield 631 covering the upper surface 620u of the silicon substrate 620 is formed, wherein the first conformal shield 631 covers a lateral surface of the grounding element 632 and the upper surface 632u of the grounding element 632 is exposed from the first conformal shield 631. The grounding element 632 is electrically connected to the grounding segment 670 of the integrated circuit 610.

Figure 29C:
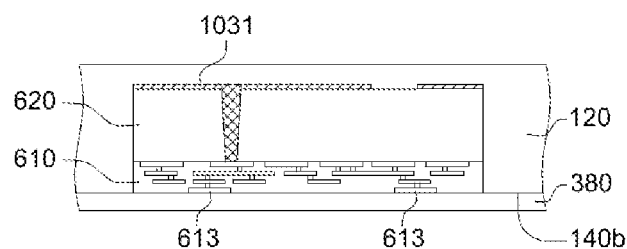

Referring to FIG. 29C, the package body 120 covering the integrated circuit structure 610 and the silicon substrate 620 is formed. The integrated circuit structure 610 and the silicon substrate 620 can be adhered onto the carrier 380 via the pad 613 before the package body 120 is formed. After the package body 120 is formed, the carrier 380 can be removed to expose the pad 613 and the lower surface 140b of the package body 120.

Figure 29D:
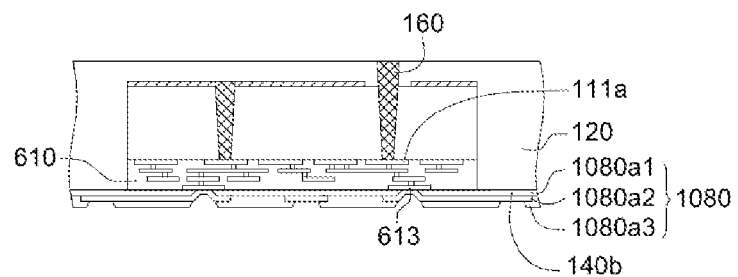

Referring to FIG. 29D, the redistribution layer 1080 is formed on the integrated circuit 610 and the lower surface 140b of the package body 120. The redistribution layer 1080 includes a first dielectric layer 1080a1, a patterned conductive layer 1080a2 and a second dielectric layer 1080a3. The first dielectric layer 1080a1 covers the lower surface 140b of the package body 120 and exposes the pad 613. The patterned conductive layer 1080a2 covers the first dielectric layer 1080a1 and is electrically connected to the pad 613. The second dielectric layer 1080a3 covers the patterned conductive layer 1080a2 and exposes a part of the patterned conductive layer 1080a2.

Referring to FIG. 29D, the first dielectric layer 1080a1 can be formed by patterning a dielectric material, which is formed by the coating technology such as printing, spinning or spraying. The formation of the second dielectric layer 1080a3 is similar to that of the first dielectric layer 1080*a*1. The patterned conductive layer 1080*a*2 can be formed by patterning a conductive material, which is formed by the material formation technology.

Referring to FIG. 29D, the feeding element 160 is produced by forming an opening in the silicon substrate 620 as well as the dielectric layer 140 and then filling the opening with conductive material, wherein the feeding element 160 is electrically connected to the feeding point 611*a* of the integrated circuit 610. Then, the electrical contact 614 as illustrated in FIG. 19 can be formed on an exposed patterned conductive layer 1080*a*2, so that the electrical contact 614 is electrically connected to the pad 613. Then, a singulation path (not illustrated) passing through the package body 120 and the redistribution layer 1080 is formed to produce the semiconductor package 1000 of FIG. 19. In an embodiment, the electrical contact 614 can be formed after the singulation path is formed.

Referring to FIGS. 30A~30E, manufacturing processes according to the semiconductor package of FIG. 20 are illustrated.

Figure 30A:
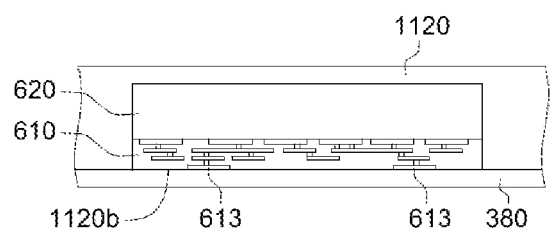
FIGS. 30A-30E illustrate manufacturing processes according to the semiconductor package of FIG. 20.

Referring to FIG. 30A, the semiconductor die including an integrated circuit structure 610 and the silicon substrate 620 is provided. After the integrated circuit 610 and the silicon substrate 620 are adhered onto the carrier 380, the package body 1120 encapsulating the semiconductor die is formed. The carrier 380 is removed to expose the pad 613 of the integrated circuit 610 and the lower surface 1120*b* of the package body 1120 after the package body 1120 is formed.

Figure 30B:
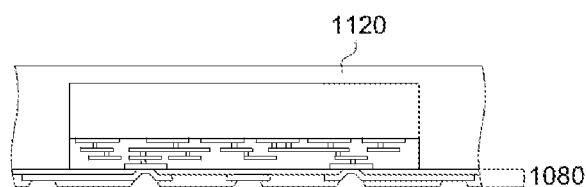

Referring to FIG. 30B, the redistribution layer 1080 is formed on the integrated circuit 610 and the lower surface 1120*b* of the package body 1120.

Figure 30C:
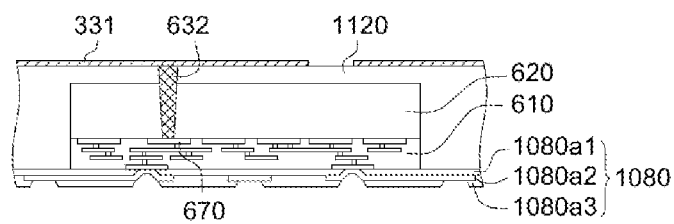

Referring to FIG. 30C, the grounding element 632 is produced by forming an opening passing through the silicon substrate 620 as well as the package body 1120 and filling the opening with conductive material, wherein the grounding element 632 is electrically connected to the grounding segment 670 of the integrated circuit 610. Then, the first conformal shielding film 331 is formed adjacent to the upper surface of the silicon substrate 620. As illustrated in FIG. 27C, the first conformal shielding film 331 is formed on the package body 1120, which is disposed adjacent to the upper surface 620*u* of the protection structure 620.

Figure 30D:
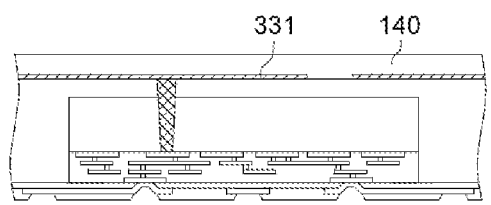

Referring to FIG. 30D, a dielectric structure 140 covering the first conformal shielding film 331 is formed.

Figure 30E:
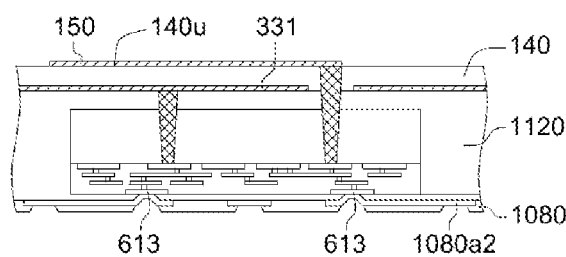

Referring to FIG. 30E, the feeding element 160 is produced by forming a through-hole passing through the package body 1120 and the dielectric structure 140 and filling the through-hole with conductive material. Then, an antenna element 150 is formed on the upper surface 140*u* of the dielectric structure 140 which directly contacts the feeding element 160. Then, an electrical contact 614, as illustrated in FIG. 20, can be formed on an exposed patterned conductive layer 1080*a*2, so that the electrical contact 614 is electrically connected to the pad 613. Then, a singulation path passing through the dielectric structure 140, the first conformal shielding film 331, the package body 1120 and the redistribution layer 1080 is formed. At this point, the formation of the semiconductor package 1100 of FIG. 20 is completed. In an embodiment, the electrical contact 614 can also be formed after the singulation path is formed.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
   a semiconductor die, the semiconductor die having an integrated circuit portion and a substrate portion, the integrated circuit portion having an active surface and the substrate portion having an inactive surface;
   a via extending from the inactive surface and electrically connected to the integrated circuit portion;
   an electromagnetic interference shield disposed on the inactive surface and electrically connected to the via;
   a package body encapsulating portions of the die and the electromagnetic interference shield, the package body having an upper surface;
   a feeding element extending from the upper surface and electrically connected to the integrated circuit portion; and
   an antenna disposed directly on the upper surface and electrically connected to the feeding element.

2. The semiconductor package of claim 1, wherein the electromagnetic interference shield includes a conformal shielding film.

3. The semiconductor package of claim 1, wherein the via is a through silicon via formed in the substrate portion.

4. The semiconductor package of claim 1, wherein the via provides a ground path for the electromagnetic interference shield.

5. The semiconductor package of claim 1, wherein the feeding element includes a conductive via.

6. The semiconductor package according to claim 1, wherein the package body has an opening from which the feeding element is exposed.

7. The semiconductor package of claim 6, wherein the feeding element comprises a first feeding sub-element and a second feeding sub-element, the first feeding sub-element passing through the substrate portion, and the second feeding sub-element passing through the package body.

8. The semiconductor package of claim 1, wherein the electromagnetic shield has an opening such that the feeding element is electrically isolated from the electromagnetic shield.

9. The semiconductor package of claim 7, wherein the first feeding sub-element is a through silicon via.

10. The semiconductor package of claim 1, further including a redistribution layer (RDL) disposed on the active surface and electrically connected thereto.

11. The semiconductor package of claim 1, further including a package substrate wherein the active surface is electrically connected to the package substrate.

12. A semiconductor package, comprising:

a semiconductor die, the semiconductor die having an integrated circuit portion and a substrate portion, the integrated circuit portion having an active surface and the substrate portion having an inactive surface;

a via extending from the inactive surface and electrically connected to the integrated circuit portion;

an electromagnetic interference shield disposed on the inactive surface and electrically connected to the via;

a dielectric layer disposed over the electromagnetic interference shield, the dielectric layer having an upper surface;

a feeding element extending from the upper surface and electrically connected to the integrated circuit portion; and an antenna disposed directly on the upper surface and electrically connected to the feeding element.

13. The semiconductor package of claim 12, wherein the electromagnetic interference shield has an opening such that the feeding element is electrically isolated from the electromagnetic shield.

14. The semiconductor package of claim 12, wherein the via provides a ground path for the electromagnetic interference shield.

15. The semiconductor package of claim 12, wherein the dielectric layer has an opening from which the feeding element is exposed.

16. The semiconductor package of claim 12, wherein the feeding element comprises a first feeding sub-element and a second feeding sub-element, the first feeding sub-element passing through the substrate portion, and the second feeding sub-element passing through the package body.

17. The semiconductor package of claim 12, further including a redistribution layer (RDL) disposed on the active surface and electrically connected thereto.

* * * * *